(12) United States Patent
Bock et al.

(10) Patent No.: US 12,192,644 B2
(45) Date of Patent: Jan. 7, 2025

(54) PULSE-WIDTH MODULATION PIXEL SENSOR

(71) Applicant: Apple Inc., Cupertino, CA (US)

(72) Inventors: Nikolai E. Bock, San Jose, CA (US); Andrew Kenneth John McMahon, San Carlos, CA (US); Dario Clocchiatti, Los Gatos, CA (US); Emanuele Mandelli, Mountain View, CA (US); Gennady A. Manokhin, Cupertino, CA (US); Robert H. Mullis, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/865,128

(22) Filed: Jul. 14, 2022

(65) Prior Publication Data
US 2023/0044950 A1  Feb. 9, 2023

Related U.S. Application Data

(60) Provisional application No. 63/227,202, filed on Jul. 29, 2021.

(51) Int. Cl.
*H04N 5/04* (2006.01)
*G04F 10/00* (2006.01)
(Continued)

(52) U.S. Cl.
CPC ........... *H04N 23/73* (2023.01); *G04F 10/005* (2013.01); *H04N 5/04* (2013.01); *H04N 23/71* (2023.01);
(Continued)

(58) Field of Classification Search
CPC .......... H04N 5/04; H04N 23/71; H04N 23/73; H04N 25/53; H04N 25/75; H04N 25/76;
(Continued)

(56) References Cited

U.S. PATENT DOCUMENTS

| 4,686,572 A | 8/1987 | Takatsu |
| 4,686,648 A | 8/1987 | Fossum |

(Continued)

FOREIGN PATENT DOCUMENTS

| CN | 1630350 | 6/2005 |
| CN | 1774032 | 5/2006 |

(Continued)

OTHER PUBLICATIONS

Bermak, et al., "An ⅝-bit Reconfigurable Digital Pixel Array with On-Chip Non-Uniform Quantizer," IEEE 2005 Custom Integrated Circuits Conference, Sep. 19, 2005, XP010873783, ISBN 978-0-7803-9023-2, pp. 223-226.

(Continued)

*Primary Examiner* — Lin Ye
*Assistant Examiner* — Chriss S Yoder, III
(74) *Attorney, Agent, or Firm* — Brownstein Hyatt Farber Schreck, LLP

(57) ABSTRACT

A pulse-width modulation (PWM) image sensor is described herein. The PWM image sensor may have a stacked configuration. A top wafer of the PWM image sensor may have a charge-to-time converter and a logic wafer, stacked with the top wafer, may include a time-to-digital converter. The PWM image sensor may utilize variable transfer functions to avoid highlight compression and may utilize non-linear time quantization. A threshold voltage, as input to a charge-to-time converter, may additionally be controlled to affect light detection, dynamic range, and other features associated with the PWM image sensor.

7 Claims, 17 Drawing Sheets

(51) Int. Cl.
*H01L 27/146* (2006.01)
*H04N 23/71* (2023.01)
*H04N 23/73* (2023.01)
*G11C 11/419* (2006.01)

(52) U.S. Cl.
CPC ....... *G11C 11/419* (2013.01); *H01L 27/14634* (2013.01)

(58) Field of Classification Search
CPC ............ H04N 25/772; H01L 27/14634; G04F 10/005; G11C 11/419
See application file for complete search history.

(56) References Cited

U.S. PATENT DOCUMENTS

| | | |
|---|---|---|
| 5,105,264 A | 4/1992 | Erhardt et al. |
| 5,329,313 A | 7/1994 | Keith |
| 5,396,893 A | 3/1995 | Oberg et al. |
| 5,471,515 A | 11/1995 | Fossum et al. |
| 5,541,402 A | 7/1996 | Ackland |
| 5,550,677 A | 8/1996 | Schofield et al. |
| 5,781,312 A | 7/1998 | Noda |
| 5,841,126 A | 11/1998 | Fossum et al. |
| 5,880,459 A | 3/1999 | Pryor et al. |
| 5,949,483 A | 9/1999 | Fossum et al. |
| 6,008,486 A | 12/1999 | Stam et al. |
| 6,040,568 A | 3/2000 | Caulfield et al. |
| 6,233,013 B1 | 5/2001 | Hosier et al. |
| 6,348,929 B1 | 2/2002 | Acharya et al. |
| 6,448,550 B1 | 9/2002 | Nishimura |
| 6,528,833 B2 | 3/2003 | Lee et al. |
| 6,541,751 B1 | 4/2003 | Bidermann |
| 6,580,454 B1 | 6/2003 | Perner et al. |
| 6,597,735 B1 | 7/2003 | Baba |
| 6,670,904 B1 | 12/2003 | Yakovlev |
| 6,713,796 B1 | 3/2004 | Fox |
| 6,714,239 B2 | 3/2004 | Guidash |
| 6,798,453 B1 | 9/2004 | Kaifu |
| 6,816,676 B2 | 11/2004 | Bianchi et al. |
| 6,905,470 B2 | 6/2005 | Lee et al. |
| 6,931,269 B2 | 8/2005 | Terry |
| 6,956,605 B1 | 10/2005 | Hashimoto |
| 6,982,759 B2 | 1/2006 | Goto |
| 7,075,049 B2 | 7/2006 | Rhodes et al. |
| 7,084,914 B2 | 8/2006 | Van Blerkom |
| 7,091,466 B2 | 8/2006 | Bock |
| 7,119,322 B2 | 10/2006 | Hong |
| 7,133,073 B1 | 11/2006 | Neter |
| 7,259,413 B2 | 8/2007 | Rhodes |
| 7,262,401 B2 | 8/2007 | Hopper et al. |
| 7,271,835 B2 | 9/2007 | Iizuka |
| 7,282,028 B2 | 10/2007 | Kim et al. |
| 7,319,218 B2 | 1/2008 | Krymski |
| 7,332,786 B2 | 2/2008 | Altice |
| 7,342,270 B2 | 3/2008 | Kuwazawa |
| 7,390,687 B2 | 6/2008 | Boettiger |
| 7,415,096 B2 | 8/2008 | Sherman |
| 7,437,013 B2 | 10/2008 | Anderson |
| 7,443,421 B2 | 10/2008 | Stavely et al. |
| 7,446,812 B2 | 11/2008 | Ando et al. |
| 7,471,315 B2 | 12/2008 | Silsby et al. |
| 7,502,054 B2 | 3/2009 | Kalapathy |
| 7,525,168 B2 | 4/2009 | Hsieh |
| 7,554,067 B2 | 6/2009 | Zarnoski et al. |
| 7,555,158 B2 | 6/2009 | Park et al. |
| 7,622,699 B2 | 11/2009 | Sakakibara et al. |
| 7,626,626 B2 | 12/2009 | Panicacci |
| 7,636,109 B2 | 12/2009 | Nakajima et al. |
| 7,671,435 B2 | 3/2010 | Ahn |
| 7,728,351 B2 | 6/2010 | Shim |
| 7,733,402 B2 | 6/2010 | Egawa et al. |
| 7,737,475 B2 | 6/2010 | Hynecek |
| 7,742,090 B2 | 6/2010 | Street |
| 7,764,312 B2 | 7/2010 | Ono et al. |
| 7,773,138 B2 | 8/2010 | Lahav et al. |
| 7,786,543 B2 | 8/2010 | Hsieh |
| 7,796,171 B2 | 9/2010 | Gardner |
| 7,817,198 B2 | 10/2010 | Kang et al. |
| 7,821,547 B2 | 10/2010 | Suzuki |
| 7,873,236 B2 | 1/2011 | Li et al. |
| 7,880,785 B2 | 2/2011 | Gallagher |
| 7,884,402 B2 | 2/2011 | Ki |
| 7,906,826 B2 | 3/2011 | Martin et al. |
| 7,952,121 B2 | 5/2011 | Arimoto |
| 7,952,635 B2 | 5/2011 | Lauxtermann |
| 7,982,789 B2 | 7/2011 | Watanabe et al. |
| 8,026,966 B2 | 9/2011 | Altice |
| 8,032,206 B1 | 10/2011 | Farazi et al. |
| 8,089,036 B2 | 1/2012 | Manabe et al. |
| 8,089,524 B2 | 1/2012 | Urisaka |
| 8,094,232 B2 | 1/2012 | Kusaka |
| 8,116,540 B2 | 2/2012 | Dean |
| 8,140,143 B2 | 3/2012 | Picard et al. |
| 8,153,947 B2 | 4/2012 | Barbier et al. |
| 8,159,570 B2 | 4/2012 | Negishi |
| 8,159,588 B2 | 4/2012 | Boemler |
| 8,164,669 B2 | 4/2012 | Compton et al. |
| 8,174,595 B2 | 5/2012 | Honda et al. |
| 8,184,188 B2 | 5/2012 | Yaghmai |
| 8,194,148 B2 | 6/2012 | Doida |
| 8,194,165 B2 | 6/2012 | Border et al. |
| 8,222,586 B2 | 7/2012 | Lee |
| 8,227,844 B2 | 7/2012 | Adkisson |
| 8,233,071 B2 | 7/2012 | Takeda |
| 8,241,205 B2 | 8/2012 | Mori |
| 8,259,228 B2 | 9/2012 | Wei et al. |
| 8,310,577 B1 | 11/2012 | Neter |
| 8,324,553 B2 | 12/2012 | Lee |
| 8,330,839 B2 | 12/2012 | Compton et al. |
| 8,338,856 B2 | 12/2012 | Tai et al. |
| 8,340,407 B2 | 12/2012 | Kalman |
| 8,350,940 B2 | 1/2013 | Smith et al. |
| 8,400,546 B2 | 3/2013 | Itano et al. |
| 8,441,545 B2 | 5/2013 | Hoda et al. |
| 8,456,540 B2 | 6/2013 | Egawa |
| 8,456,559 B2 | 6/2013 | Yamashita |
| 8,462,247 B2 | 6/2013 | Kim |
| 8,508,637 B2 | 8/2013 | Han et al. |
| 8,514,308 B2 | 8/2013 | Itonaga et al. |
| 8,520,913 B2 | 8/2013 | Dean |
| 8,546,737 B2 | 10/2013 | Tian et al. |
| 8,547,388 B2 | 10/2013 | Cheng |
| 8,575,531 B2 | 11/2013 | Hynecek et al. |
| 8,581,992 B2 | 11/2013 | Hamada |
| 8,594,170 B2 | 11/2013 | Mombers et al. |
| 8,619,163 B2 | 12/2013 | Ogura et al. |
| 8,619,170 B2 | 12/2013 | Mabuchi |
| 8,629,484 B2 | 1/2014 | Ohri et al. |
| 8,634,002 B2 | 1/2014 | Kita |
| 8,648,947 B2 | 2/2014 | Sato et al. |
| 8,723,975 B2 | 5/2014 | Solhusvik |
| 8,730,345 B2 | 5/2014 | Watanabe |
| 8,754,983 B2 | 6/2014 | Sutton |
| 8,755,854 B2 | 6/2014 | Addison et al. |
| 8,759,736 B2 | 6/2014 | Yoo |
| 8,767,104 B2 | 7/2014 | Makino et al. |
| 8,803,990 B2 | 8/2014 | Smith |
| 8,810,703 B2 | 8/2014 | Machida |
| 8,817,154 B2 | 8/2014 | Manabe et al. |
| 8,860,871 B2 | 10/2014 | Aoki |
| 8,879,686 B2 | 11/2014 | Okada et al. |
| 8,902,330 B2 | 12/2014 | Theuwissen |
| 8,902,341 B2 | 12/2014 | Mabuchi |
| 8,908,062 B2 | 12/2014 | Ito |
| 8,908,073 B2 | 12/2014 | Minagawa |
| 8,923,994 B2 | 12/2014 | Laikari et al. |
| 8,934,030 B2 | 1/2015 | Kim et al. |
| 8,936,552 B2 | 1/2015 | Kateraas et al. |
| 8,946,610 B2 | 2/2015 | Iwabuchi et al. |
| 8,981,517 B2 | 3/2015 | Oshiyama et al. |
| 8,982,237 B2 | 3/2015 | Chen |
| 8,982,260 B2 | 3/2015 | Eshraghian et al. |
| 8,988,598 B2 | 3/2015 | Ovsiannikov |

(56) References Cited

U.S. PATENT DOCUMENTS

| | | |
|---|---|---|
| 9,001,251 B2 | 4/2015 | Smith et al. |
| 9,041,837 B2 | 5/2015 | Li |
| 9,017,748 B2 | 6/2015 | Spelman et al. |
| 9,054,009 B2 | 6/2015 | Oike et al. |
| 9,066,017 B2 | 6/2015 | Geiss |
| 9,066,660 B2 | 6/2015 | Watson et al. |
| 9,088,727 B2 | 7/2015 | Trumbo |
| 9,094,623 B2 | 7/2015 | Kawaguchi |
| 9,099,604 B2 | 8/2015 | Roy |
| 9,100,597 B2 | 8/2015 | Hu |
| 9,106,859 B2 | 8/2015 | Kizuna et al. |
| 9,131,171 B2 | 9/2015 | Aoki et al. |
| 9,154,750 B2 | 10/2015 | Pang |
| 9,160,949 B2 | 10/2015 | Zhang et al. |
| 9,225,948 B2 | 12/2015 | Hasegawa |
| 9,232,150 B2 | 1/2016 | Kleekajai et al. |
| 9,232,161 B2 | 1/2016 | Suh |
| 9,270,906 B2 | 2/2016 | Peng et al. |
| 9,276,031 B2 | 3/2016 | Wan |
| 9,277,144 B2 | 3/2016 | Kleekajai et al. |
| 9,287,304 B2 | 3/2016 | Park et al. |
| 9,287,423 B2 | 3/2016 | Mori et al. |
| 9,288,380 B2 | 3/2016 | Nomura |
| 9,288,404 B2 | 3/2016 | Papiashvili |
| 9,293,500 B2 | 3/2016 | Sharma et al. |
| 9,307,161 B2 | 4/2016 | Lee |
| 9,319,611 B2 | 4/2016 | Fan |
| 9,344,649 B2 | 5/2016 | Bock |
| 9,374,105 B2 | 6/2016 | Eddleman et al. |
| 9,380,245 B1 | 6/2016 | Guidash |
| 9,392,237 B2 | 7/2016 | Toyoda |
| 9,438,258 B1 | 9/2016 | Yoo |
| 9,445,018 B2 | 9/2016 | Fettig et al. |
| 9,451,887 B2 | 9/2016 | Watson et al. |
| 9,467,553 B2 | 10/2016 | Heo et al. |
| 9,473,706 B2 | 10/2016 | Malone et al. |
| 9,479,688 B2 | 10/2016 | Ishii |
| 9,490,285 B2 | 11/2016 | Itonaga |
| 9,497,397 B1 | 11/2016 | Kleekajai et al. |
| 9,503,616 B2 | 11/2016 | Taniguchi et al. |
| 9,521,337 B1 | 12/2016 | Shen |
| 9,538,067 B2 | 1/2017 | Hamada |
| 9,538,106 B2 | 1/2017 | McMahon et al. |
| 9,549,099 B2 | 1/2017 | Fan |
| 9,571,758 B2 | 2/2017 | Hashimoto et al. |
| 9,584,743 B1 | 2/2017 | Lin et al. |
| 9,584,744 B2 | 2/2017 | Lenchenkov et al. |
| 9,596,420 B2 | 3/2017 | Fan et al. |
| 9,596,423 B1 | 3/2017 | Molgaard |
| 9,608,024 B2 | 3/2017 | Lee et al. |
| 9,609,250 B2 | 3/2017 | Lee et al. |
| 9,654,689 B2 | 5/2017 | Gleason |
| 9,661,210 B2 | 5/2017 | Haneda |
| 9,666,618 B2 | 5/2017 | Meynants |
| 9,686,485 B2 | 6/2017 | Agranov et al. |
| 9,700,240 B2 | 7/2017 | Letchner et al. |
| 9,741,754 B2 | 8/2017 | Li et al. |
| 9,749,556 B2 | 8/2017 | Fettig et al. |
| 9,754,994 B2 | 9/2017 | Koo et al. |
| 9,774,318 B2 | 9/2017 | Song |
| 9,781,368 B2 | 10/2017 | Song |
| 9,819,890 B2 | 11/2017 | Wang et al. |
| 9,857,469 B2 | 1/2018 | Oggier et al. |
| 9,888,198 B2 | 2/2018 | Mauritzson et al. |
| 9,894,304 B1 | 2/2018 | Smith |
| 9,912,883 B1 | 3/2018 | Lee |
| 9,918,031 B2 | 3/2018 | Sakioka et al. |
| 9,936,105 B2 | 4/2018 | Furuya |
| 9,936,151 B2 | 4/2018 | Wang et al. |
| 9,952,323 B2 | 4/2018 | Deane |
| 9,973,678 B2 | 5/2018 | Mandelli et al. |
| 10,044,954 B2 | 8/2018 | Ikeda et al. |
| 10,051,217 B2 | 8/2018 | Kondo et al. |
| 10,104,318 B2 | 10/2018 | Smith |
| 10,120,446 B2 | 11/2018 | Pance et al. |
| 10,136,090 B2 | 11/2018 | Vogelsang et al. |
| 10,178,329 B2 | 1/2019 | Vogelsang et al. |
| 10,212,378 B2 | 2/2019 | Negishi |
| 10,217,889 B2 | 2/2019 | Dhulla et al. |
| 10,249,660 B2 | 4/2019 | Guidash et al. |
| 10,250,833 B2 | 4/2019 | Wang et al. |
| 10,263,032 B2 | 4/2019 | Wan |
| 10,269,857 B2 | 4/2019 | Wu et al. |
| 10,271,037 B2 | 4/2019 | Oh |
| 10,285,626 B1 | 5/2019 | Kestelli et al. |
| 10,306,167 B2 | 5/2019 | Shimasaki |
| 10,334,181 B2 | 6/2019 | Guenter et al. |
| 10,379,317 B2 | 8/2019 | Shimokawa et al. |
| 10,205,904 B2 | 9/2019 | Kobayashi |
| 10,431,608 B2 | 10/2019 | Ebihara |
| 10,440,301 B2 | 10/2019 | Li et al. |
| 10,447,950 B2 | 10/2019 | Wang |
| 10,484,627 B2 | 11/2019 | Zhou |
| 10,542,229 B2 | 1/2020 | Sakioka et al. |
| 10,594,961 B2 | 3/2020 | Hirota et al. |
| 10,609,348 B2 | 3/2020 | Agranov et al. |
| 10,630,920 B2 | 4/2020 | Matsunaga |
| 10,630,929 B2 | 4/2020 | Koizumi et al. |
| 10,748,955 B2 | 8/2020 | Oh et al. |
| 10,775,605 B2 | 9/2020 | Ollila |
| 10,848,693 B2 | 11/2020 | Agranov et al. |
| 10,854,647 B2 | 12/2020 | Huang |
| 10,943,935 B2 | 3/2021 | Li et al. |
| 10,943,940 B2 | 3/2021 | Wu et al. |
| 10,951,838 B2 | 3/2021 | Eyama |
| 11,019,294 B2 | 5/2021 | McMahon |
| 11,252,381 B2 | 2/2022 | Pang et al. |
| 11,258,993 B2 | 2/2022 | Hoshino |
| 11,350,052 B2 | 5/2022 | Otaka |
| 11,405,575 B2 | 7/2022 | Bairo |
| 11,546,532 B1 | 1/2023 | Bahukhandi et al. |
| 2003/0036685 A1 | 2/2003 | Goodman et al. |
| 2004/0207836 A1 | 10/2004 | Chhibber et al. |
| 2005/0026332 A1 | 2/2005 | Fratti et al. |
| 2006/0274161 A1 | 12/2006 | Ing et al. |
| 2007/0263099 A1 | 11/2007 | Motta et al. |
| 2008/0177162 A1 | 7/2008 | Bae et al. |
| 2008/0315198 A1 | 12/2008 | Jung |
| 2009/0096901 A1 | 4/2009 | Bae et al. |
| 2009/0101914 A1 | 4/2009 | Hirotsu et al. |
| 2009/0146234 A1 | 6/2009 | Luo et al. |
| 2009/0189842 A1 | 7/2009 | Huang |
| 2009/0201400 A1 | 8/2009 | Zhang et al. |
| 2009/0219266 A1 | 9/2009 | Lim et al. |
| 2010/0134631 A1 | 6/2010 | Voth |
| 2011/0080500 A1 | 4/2011 | Wang et al. |
| 2011/0109776 A1 | 5/2011 | Kawai |
| 2011/0156197 A1 | 6/2011 | Tivarus et al. |
| 2011/0164162 A1 | 7/2011 | Kato |
| 2012/0068978 A1 | 3/2012 | Aitken et al. |
| 2012/0092541 A1 | 4/2012 | Tuulos et al. |
| 2013/0147981 A1 | 6/2013 | Wu |
| 2014/0071321 A1 | 3/2014 | Seyama |
| 2014/0078356 A1 | 3/2014 | Vaartstra |
| 2015/0062391 A1 | 3/2015 | Murata |
| 2015/0295589 A1 | 10/2015 | Eddleman et al. |
| 2016/0050379 A1 | 2/2016 | Jiang et al. |
| 2016/0219232 A1 | 7/2016 | Murata |
| 2016/0344920 A1 | 11/2016 | Iwahara |
| 2017/0047363 A1 | 2/2017 | Choi et al. |
| 2021/0281789 A1 | 9/2021 | McMahon |
| 2022/0046196 A1 | 2/2022 | Li |
| 2022/0102414 A1 | 3/2022 | Lee et al. |
| 2022/0130876 A1 | 4/2022 | Park et al. |
| 2022/0190023 A1 | 6/2022 | Jeong et al. |
| 2022/0375986 A1 | 11/2022 | Rosenblum et al. |
| 2023/0090827 A1 | 3/2023 | Li et al. |

FOREIGN PATENT DOCUMENTS

| | | |
|---|---|---|
| CN | 1833429 | 9/2006 |
| CN | 1842138 | 10/2006 |
| CN | 1947414 | 4/2007 |
| CN | 101189885 | 5/2008 |

(56) References Cited

FOREIGN PATENT DOCUMENTS

| | | |
|---|---|---|
| CN | 101221965 | 7/2008 |
| CN | 101233763 | 7/2008 |
| CN | 101472059 | 7/2009 |
| CN | 101567977 | 10/2009 |
| CN | 101622859 | 1/2010 |
| CN | 101739955 | 6/2010 |
| CN | 101754029 | 6/2010 |
| CN | 101803925 | 8/2010 |
| CN | 102036020 | 4/2011 |
| CN | 102067584 | 5/2011 |
| CN | 102208423 | 10/2011 |
| CN | 102411908 A | 4/2012 |
| CN | 102451160 | 5/2012 |
| CN | 102668542 | 9/2012 |
| CN | 102820309 | 12/2012 |
| CN | 102821255 | 12/2012 |
| CN | 103024297 | 4/2013 |
| CN | 103051843 | 4/2013 |
| CN | 103329513 | 9/2013 |
| CN | 103369261 | 10/2013 |
| CN | 103369261 A | 10/2013 |
| CN | 103546702 | 1/2014 |
| CN | 104041009 | 9/2014 |
| CN | 104052919 | 9/2014 |
| CN | 204761615 | 11/2015 |
| CN | 205211754 | 5/2016 |
| CN | 106027921 A | 10/2016 |
| CN | 111602386 A | 8/2020 |
| CN | 112087146 A | 12/2020 |
| EP | 814606 | 2/2002 |
| EP | 1763228 | 3/2007 |
| EP | 2023611 | 2/2009 |
| EP | 2107610 | 10/2009 |
| EP | 2230690 | 9/2010 |
| EP | 2512126 | 10/2012 |
| GB | 2601833 | 6/2022 |
| JP | S61123287 | 6/1986 |
| JP | 2000059697 | 2/2000 |
| JP | 2001211455 | 8/2001 |
| JP | 2001358994 | 12/2001 |
| JP | 2004111590 | 4/2004 |
| JP | 2005318504 | 11/2005 |
| JP | 2006287361 | 10/2006 |
| JP | 2007504670 | 3/2007 |
| JP | 2007516654 | 6/2007 |
| JP | 2008507908 | 3/2008 |
| JP | 2008271280 | 11/2008 |
| JP | 2008543061 | 11/2008 |
| JP | 2009021809 | 1/2009 |
| JP | 4255223 | 4/2009 |
| JP | 2009159186 | 7/2009 |
| JP | 2009212909 | 9/2009 |
| JP | 2009296465 | 12/2009 |
| JP | 2010080604 | 4/2010 |
| JP | 2010114834 | 5/2010 |
| JP | 2011040926 | 2/2011 |
| JP | 2011049697 | 3/2011 |
| JP | 2011091775 | 5/2011 |
| JP | 2011216970 | 10/2011 |
| JP | 2011217315 | 10/2011 |
| JP | 2011097646 | 12/2011 |
| JP | 2012010306 | 1/2012 |
| JP | 2012019516 | 1/2012 |
| JP | 2012513160 | 6/2012 |
| JP | 2013005397 | 1/2013 |
| JP | 2013051523 | 3/2013 |
| JP | 2013070240 | 4/2013 |
| JP | 2013529035 | 7/2013 |
| KR | 20030034424 | 5/2003 |
| KR | 20030061157 | 7/2003 |
| KR | 20050103732 | 11/2005 |
| KR | 2008/0069851 | 7/2008 |
| KR | 20090082077 | 7/2009 |
| KR | 20090102412 | 9/2009 |
| KR | 20100008239 | 1/2010 |
| KR | 20100065084 | 6/2010 |
| KR | 20110137934 | 12/2011 |
| KR | 20130074459 | 7/2013 |
| KR | 20000035234 | 6/2020 |
| TW | 200520551 | 6/2005 |
| TW | 200803481 | 1/2008 |
| TW | 201110689 | 3/2011 |
| TW | 201301881 | 1/2013 |
| WO | WO 05/041304 | 5/2005 |
| WO | WO 06/014641 | 2/2006 |
| WO | WO 06/130443 | 12/2006 |
| WO | WO 07/049900 | 5/2007 |
| WO | WO 10/120945 | 10/2010 |
| WO | WO 12/053363 | 4/2012 |
| WO | WO 12/088338 | 6/2012 |
| WO | WO 12/122572 | 9/2012 |
| WO | WO 12/138687 | 10/2012 |
| WO | WO 13/008425 | 1/2013 |
| WO | WO 13/179018 | 12/2013 |
| WO | WO 13/179020 | 12/2013 |
| WO | WO 19/102887 | 5/2019 |
| WO | WO2019108632 | 6/2019 |
| WO | WO 20/228392 | 11/2020 |

OTHER PUBLICATIONS

Li et al., "Smart Image Sensor with Integrated Low Complexity Image Processing for Wireless Endoscope Capsules," *Tsinghua Science and Technology*, vol. 14, No. 5, Oct. 2009, pp. 586-592.

Posch et al., "A QVGA 143 dB Dynamic Range Frame-Free PWM Image Sensor With Lossless Pixel-Level Video Compression and Time-Domain CDS," *IEEE Journal of Solid-State Circuits*, Jan. 2011, vol. 46, No. 1, pp. 259-275.

Aoki, et al., "Rolling-Shutter Distortion-Free 3D Stacked Image Sensor with −160dB Parasitic Light Sensitivity In-Pixel Storage Node," ISSCC 2013, Session 27, Image Sensors, 27.3 27.3 A, Feb. 20, 2013, retrieved on Apr. 11, 2014 from URL:http://ieeexplore.ieee.org/stamp/stamp.jsp?tp=&arnumber=6487824.

Elgendi, "On the Analysis of Fingertip Photoplethysmogram Signals," *Current Cardiology Reviews*, 2012, vol. 8, pp. 14-25.

Feng, et al., "On the Stoney Formula for a Thin Film/Substrate System with Nonuniform Substrate Thickness," *Journal of Applied Mechanics*, Transactions of the ASME, vol. 74, Nov. 2007, pp. 1276-1281.

Fontaine, "The State-of-the-Art of Smartphone Imagers," 2019 International Image Sensor Workshop, Snowbird, Utah, Jun. 23-27, 2019, 3 pages.

Fu, et al., "Heart Rate Extraction from Photoplethysmogram Waveform Using Wavelet Multi-resolution Analysis," *Journal of Medical and Biological Engineering*, 2008, vol. 28, No. 4, pp. 229-232.

Han, et al., "Artifacts in wearable photoplethysmographs during daily life motions and their reduction with least mean square based active noise cancellation method," *Computers in Biology and Medicine*, 2012, vol. 42, pp. 387-393.

Jang et al., "A new PDAF correction method of CMOS image sensor with Nonacell and Super PD to improve image quality in binning mode," IS&T International Symposium on Electronic Imaging 2021, Image Quality and System Performance XVIII, 5 pages.

Lopez-Silva, et al., "Heuristic Algorithm for Photoplethysmographic Heart Rate Tracking During Maximal Exercise Test," *Journal of Medical and Biological Engineering*, 2011, vol. 12, No. 3, pp. 181-188.

Santos, et al., "Accelerometer-assisted PPG Measurement During Physical Exercise Using the LAVIMO Sensor System," *Acta Polytechnica*, 2012, vol. 52, No. 5, pp. 80-85.

Sarkar, et al., "Fingertip Pulse Wave (PPG signal) Analysis and Heart Rate Detection," *International Journal of Emerging Technology and Advanced Engineering*, 2012, vol. 2, No. 9, pp. 404-407.

Schwarzer, et al., On the determination of film stress from substrate bending: Stoney's formula and its limits, Jan. 2006, 19 pages.

Shen et al., "Stresses, Curvatures, and Shape Changes Arising from Patterned Lines on Silicon Wafers," Journal of Applied Physics, vol. 80, No. 3, Aug. 1996, pp. 1388-1398.

(56) References Cited

OTHER PUBLICATIONS

Yan, et al., "Reduction of motion artifact in pulse oximetry by smoothed pseudo Wigner-Ville distribution," *Journal of NeuroEngineering and Rehabilitation*, 2005, vol. 2, No. 3, pp. 1-9.
Yousefi, et al., "Adaptive Cancellation of Motion Artifact in Wearable Biosensors," 34th Annual International Conference of the IEEE EMBS, San Diego, California, Aug./Sep. 2012, pp. 2004-2008.
JP Office Action; May 23, 2024; JP Patent Application No. 2022-121474; 2 pgs.
Christoph Posch et al. and "A QVGA 143 dB Dynamic Range Frame-Free PWM Image Sensor With Lossless Pixel-Level Video Compression and Time-Domain CDS", IEEE, and IEEE Journal of Solid-State Circuits, IEEE, Nov. 29, 2010, vol. 46, No. 1, pp. 259-275, DOI: 10.1109-/JSSC.2010.2085952; 17 pgs.

1550

| ADDRESS | LUT1 | ADDRESS | LUT2 | LUT3 | LUT4 | LUT5 |
|---------|------|---------|------|------|------|------|
| . | . | . | . | . | . | . |
| . | . | . | . | . | . | . |
| S | $C\log_2 S$ | n | K | $C\log_2 K$ | $t_{min}$ | $T_{DET}$ |
| . | . | . | . | . | . | . |
| . | . | . | . | . | . | . |

*FIG. 15B*

PULSE-WIDTH MODULATION PIXEL SENSOR

CROSS-REFERENCE TO RELATED APPLICATION

This application is a nonprovisional and claims the benefit under 35 U.S.C. 119(e) of U.S. Provisional Patent Application No. 63/227,202, filed Jul. 29, 2021, the contents of which are incorporated herein by reference as if fully disclosed herein.

FIELD

The present invention relates generally to image sensors and, particularly, to pulse-width modulation image sensors and methods for using the same.

BACKGROUND

Cameras and other image recording devices may use one or more image sensors, such as a charged-coupled device (CCD) image sensor or a complementary metal-oxide-semiconductor (CMOS) image sensor. A typical CMOS image sensor may include a two-dimensional array of pixels, where each pixel may include a photodiode and one or more transistors used to activate and read each pixel.

In CMOS image sensors, any movement in a subject imaged by a CMOS image sensor may blur the image of the subject, or may otherwise cause different types of motion artifacts. CMOS image sensors may struggle in obtaining a high dynamic range (HDR) for a single shot, as high-contrast areas of an image may be depicted as too dark or too bright. CMOS image sensors may additionally have a finite full-well capacity, which may limit a dynamic range of an output image and result in failing to capture a full range of light intensities represented in a scene.

SUMMARY

This summary is provided to introduce a selection of concepts in simplified form that are further described herein. This summary is not intended to identify key features or essential features of the claimed subject matter, nor is it intended to be used as an aid in determining the scope of the claimed subject matter.

According to some embodiments of the provided disclosure, a method of operation of a pulse-width modulation (PWM) image sensor may be provided. The method may comprise, during a detection period, receiving a number of photons at a PWM pixel of the PWM image sensor, converting the number of photons into a photocurrent as the number of photons is received, accumulating a number of electrons at a sense node during the detection period, the number of electrons accumulated in response to the sense node receiving the photocurrent, during and in synchronization with the detection period, incrementing a count in accordance with a non-linear relationship between a triggering time and the photocurrent, the count synchronized with a time reference, and, when the accumulated number of electrons reaches a threshold number of electrons, latching a value of the count in a memory of a time-to-digital converter (TDC) circuit.

In some embodiments, as the triggering time increases, the count increments at a decreased rate. Further, the time reference, t, may be defined by $$t = \frac{2^b * t_{min}}{2^b - n},$$

where b is a bit depth of the TDC circuit, n is a counter step number, and $t_{min}$ is a counter delay. The counter delay may further be defined by $$t_{min} = \frac{q * N_{TH}}{I_{max}},$$

where q is an elementary charge, $N_{TH}$ is the threshold number of electrons, and $I_{max}$ is a maximum producible photocurrent.

A method in accordance with the provided disclosure may further comprise transmitting image information, corresponding to the latched value of the count in the memory of the TDC circuit, via a bi-directional bus. The method may further comprise terminating a duration of the detection period in response to the photocurrent. In some embodiments, a higher photocurrent may result in a shorter detection period and a lower photocurrent may result in a longer detection period.

In some embodiments, a method of performing auto-exposure control for a pulse-width modulation (PWM) image sensor may be provided. The method may comprise querying first values associated with initial exposure settings of the PWM image sensor from a lookup table of the PWM image sensor, the first values comprising at least a clock frequency, a detection time, and a threshold number of electrons for operating the PWM image sensor, dividing the clock frequency by a division coefficient, the division coefficient based at least in part on the threshold number of electrons and the detection time, to obtain an updated clock frequency, using the updated clock frequency, determining whether a conversion time is less than or equal to the detection time, and, in accordance with determining that the conversion time is less than or equal to the detection time, sustaining the initial exposure settings.

A method in accordance with the provided disclosure may additionally comprise using the PWM image sensor to generate signals corresponding to light reflected from a scene, using the signals generated by the PWM image sensor, calculating a mean brightness value, using the mean brightness value to identify a row of the lookup table including second values comprising at least a second division coefficient, a second detection time, and a counter delay, and using at least the second division coefficient, the second detection time, and the counter delay to convert the initial exposure settings to updated exposure settings, thereby changing an operation of the PWM image sensor.

A method in accordance with the provided disclosure may further comprise, when the conversion time is greater than the detection time, calculating a second detection time and using the second detection time to change the initial exposure settings of the PWM image sensor to updated exposure settings.

In some cases, the threshold number of electrons may be a maximum threshold number of electrons and the method may further comprise, when the conversion time is greater than the detection time, decreasing the maximum threshold number of electrons and performing a new exposure operation using the decreased maximum threshold number of electrons.

Calculating the second detection time, $T_{DET}$, may be defined by $$T_{DET} = \frac{2^b(2^b - 2)K}{F_{clk}},$$

where b is a bit depth, K is the division coefficient, and Falk is the clock frequency. Determining whether the conversion time is less than or equal to the detection time may comprise evaluating $$\frac{(2^b - 2)K}{F_{clk}} \leq \frac{T_{DET}}{2^b},$$

where b is a bit depth, K is the division coefficient, Falk is the clock frequency, and $T_{DET}$ is the detection time. A value for the division coefficient may be based on a maximum detectable photocurrent capable of being generated by a photodiode of the PWM image sensor.

In some embodiments, a pulse-width modulation (PWM) image sensor may be provided. The PWM image sensor may comprise a top wafer comprising a charge-to-time converter (CTC) circuit, the CTC circuit comprising a photodiode, a reset gate, and a comparator and a bottom wafer stacked with the top wafer and comprising a time-to-digital converter (TDC) circuit. In some embodiments a reset signal may be applied to the reset gate to initiate a detection period, during the detection period, the photodiode may accumulate a number of electrons, and when the number of electrons reaches a threshold number of electrons, the CTC circuit may transmit a write signal, from the comparator, to the TDC circuit.

In some embodiments, the TDC circuit may be a static random-access memory comprising a number of latches and the write signal may latch a count in the number of latches.

A threshold voltage may be applied to the comparator and the threshold number of electrons may correspond to the threshold voltage applied to the comparator. The CTC circuit and the TDC circuit may comprise a pixel and the PWM image sensor may further comprise a number of pixels, each pixel of the number of pixels comprising a respective CTC circuit and a respective TDC circuit pair. Each pixel of the number of pixels may be arranged in an array and may be read row-by-row. The top wafer and the bottom wafer may be communicatively coupled by at least one of a vertical transfer gate, a through-silicon via, or a bond pad.

BRIEF DESCRIPTION OF THE DRAWINGS

Reference will now be made to representative embodiments illustrated in the accompanying figures. It should be understood that the following descriptions are not intended to limit the embodiments to one or more preferred embodiments. To the contrary, they are intended to cover alternatives, modifications, and equivalents as may be included within the spirit and scope of the described embodiments as defined by the appended claims. Similar reference numerals have been used, where practicable, to designate similar features.

FIGS. 15A-15B depict example methods and configurations of auto-exposure control, as discussed herein.

Figure 1A:
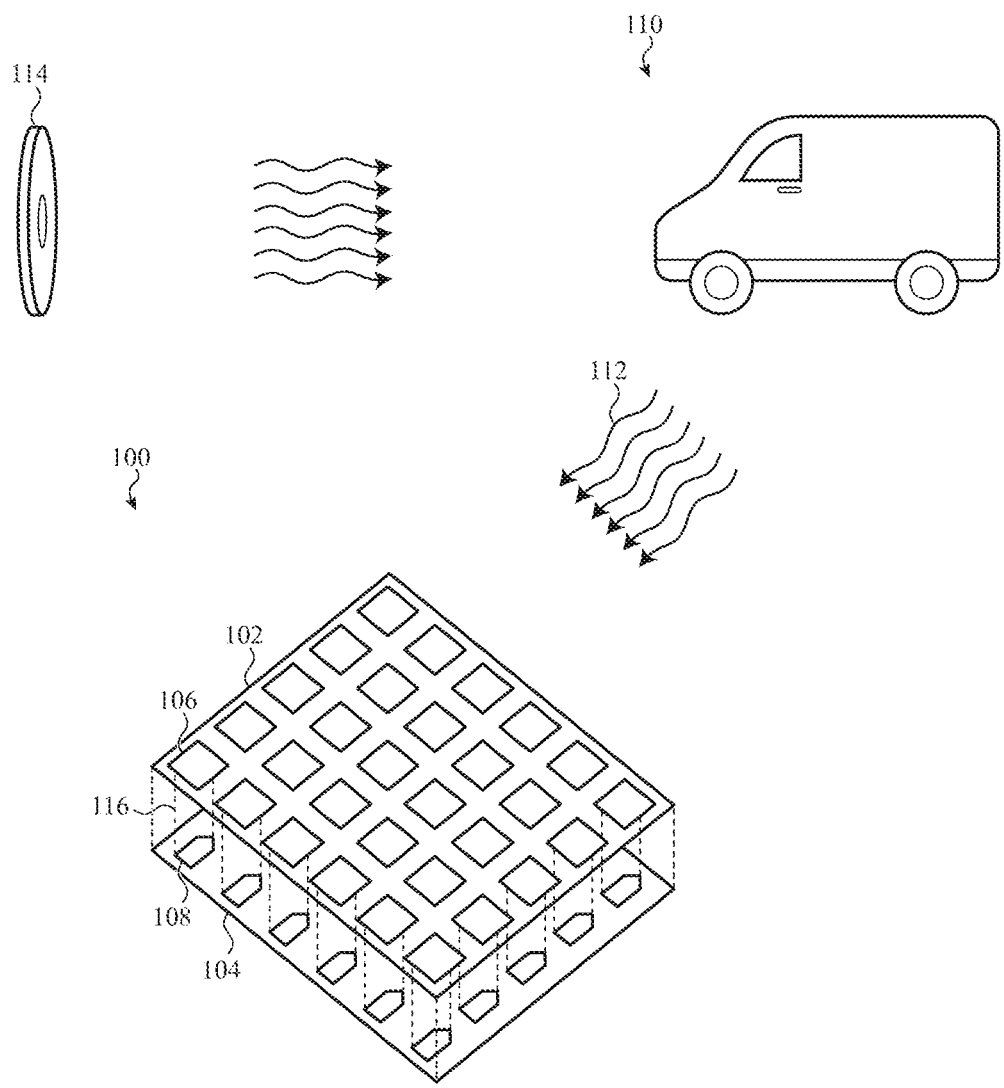
FIGS. 1A-1C illustrate an example pulse-width modulation (PWM) image sensor, comprising an array of pixels, and components thereof, as discussed herein.

The use of cross-hatching or shading in the accompanying figures is generally provided to clarify the boundaries between adjacent elements and to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

The provided disclosure relates to pulse-width modulation (PWM) image sensors and, particularly, to PWM image sensor arrays on a stacked wafer that orient a charge-to-time converter (CTC) and a time-to-digital converter (TDC) in a Z-direction, thereby reducing a size of an image sensor pixel in an XY-plane. Further aspects of the provided disclosure provide flexible control of a transfer function of a TDC of a PWM image sensor. Other aspects of the provided disclosure are additionally provided herein.

Many electronic devices, such as smart phones, tablets, laptop computers, and so on, comprise one or more cameras for capturing image and/or video information. For example, a smart phone may have one or more cameras configured to capture high-resolution images and videos. The captured images and videos may be stored in a local storage of the smart phone and/or may be transmitted, via a network, to other devices for the purposes of sharing social media, such as pictures or videos, with other users and/or for any other purpose where images or videos are used.

Image sensors may be used in various types of cameras, as referenced above, and may comprise an array of multiple pixels which convert analog information (e.g., electromagnetic radiation, such as light waves) into digital signals for use in, and/or display on, an electronic device. Through this process of analog-to-digital conversion, a digital image may be created that corresponds to a scene and/or real-world objects that are the subjects of an image-capture operation. The digital image may be created by agglomerating digital signals from each pixel associated with the image sensor. As a result, increasing a number of pixels for a particular image sensor may cause a corresponding increase in a resolution of a resulting image.

However, electronic devices typically have limited space for internal components, as other components typical in electronic devices, such as microphones, displays, sensors, and so on, may require a portion of the limited space available in an electronic device. There is, therefore, limited space for pixels in an image sensor and a resolution of an image sensor may likewise be limited by the amount of space available. Furthermore, design considerations (e.g., a device thickness or aesthetic appearance) may further limit the amount of space available in a particular electronic device, which may further limit space available for an array of image sensor pixels, thereby resulting in a decreased resolution of images captured by an associated image sensor and/or camera.

Additionally, certain image sensor architecture, such as certain CMOS sensor architectures, may produce images with certain deficiencies in quality. For example, traditional sensors may struggle producing high quality images in low or high light conditions, in situations where an object is moving with respect to the image sensor, in producing images without pixel saturation, and in producing images with a high dynamic range.

The provided disclosure relates to a PWM image sensor that may have a reduced pixel size, thereby increasing a number of potential pixels in a particular area, may permit flexible control of a digital-domain transfer function, may provide single-shot high dynamic range (HDR) imaging, may reduce movement-blur, and may provide additional functionality as described below. The PWM image sensor may utilize PWM control during time-based conversion processes, by, for example, controlling a switch supplying voltage and current to a load. The average value of the voltage and current may be modified by changing a rate of the switch.

In accordance with the provided disclosure, a PWM image sensor may comprise a charge-to-time converter (CTC) and a time-to-digital converter (TDC). The CTC may be positioned on a top wafer and the TDC may be positioned on a logic wafer, where the logic wafer is positioned below the top wafer in a vertical orientation (e.g., a Z-direction). By utilizing space in the Z-direction, the PWM image sensor may have a higher pixel density in an XY-plane. Stacking the CTC and the TDC at the wafer-level may further reduce the overall die and/or module size when compared to traditional image sensors.

The CTC may be communicatively coupled with the TDC, such as through one or more electrical traces, and may transmit write signals to the TDC. As discussed herein, the CTC may generate a write (WRT) signal when a sense node, otherwise referenced as a floating diffusion (FD), of the CTC accumulates a threshold number of electrons from a photocurrent generated by a photodiode of the CTC. Once the threshold number of electrons is reached, the WRT signal may be generated and sent to the TDC in order to latch, or otherwise mark, image data. In some cases, the threshold value for the threshold number of electrons is modifiable, either manually or automatically, in order to minimize a signal-to-noise ratio (SNR), extend a dynamic range (for all pixels, or a portion thereof, of the PWM sensor), control an exposure setting, and so on.

The TDC may further permit control of a transfer function in a digital domain during the time-to-digital conversion process. Through control of the transfer function, a dynamic range (DR) of the PWM image sensor may be extended during certain conditions (e.g., low-light conditions or high-light conditions). Control of various additional functions, such as over a SNR, exposure settings (either manual or automatic), selection of triggering time, and so on, may be achieved through the use of the PWM image sensor.

These and other embodiments are discussed below with reference to FIGS. 1A-16. However, those skilled in the art will readily appreciate that the detailed description given herein with respect to these figures is for explanatory purposes only and should not be construed as limiting.

FIG. 1A illustrates an example pulse-width modulation (PWM) image sensor 100 capturing light 112 reflected from an object 110. In FIG. 1, the object 110 is depicted as an automobile, though it is appreciated that any object, or combination of objects, may be the subject of an image detection operation of a PWM image sensor 100. For example, a face of a user of an electronic device within which the PWM image sensor 100 is disposed may be a subject as detected by the PWM image sensor 100.

During an image detection operation, light 112 is reflected from an object 110, and/or scene, and is received at a PWM image sensor 100 and, in particular, at one or more photodiodes of the PWM image sensor 100. As described herein, the light 112 may be natural light (e.g., produced the Sun), external artificial light (e.g., from external bulbs), or artificial light sources associated with the PWM image sensor 100 (e.g., a light source of a flash-emitting element). An example light source 114 is depicted in FIG. 1 and may be omitted in some embodiments. In some cases, the light source 114 is a light-emitting diode and may be used as a flashlight and/or camera flash. The light source 114 may be operatively coupled with the PWM image sensor 100. The light 112 may, in some implementations, be light that is not visible to the human eye including, for example, infrared or ultraviolet light.

The PWM image sensor 100 may comprise multiple layers, such as a top wafer 102 and a bottom logic wafer 104. The top wafer 102 and the bottom logic wafer 104 may be formed from a semiconductor material, such as silicon (Si) or gallium arsenide (GaAs), and may be bonded together in a number of manners, such as, but not limited to, direct bonding, plasma activated bonding, eutectic bonding, hybrid bonding, any combination thereof, and so on. In some cases, the top wafer 102 and the bottom logic wafer 104 are on opposite sides of a single wafer.

A charge-to-time converter (CTC) array 106 may be positioned on the top wafer 102. As depicted in FIG. 1A, the CTC array 106 may comprise a number of CTC pixels arranged in a regular and repeating manner, though any manner of arrangement of the CTC pixels may be used in accordance with the provided disclosure. The CTC array 106 may be formed on the top wafer 102 through the use of any potential technique or combination of techniques such as, for example, epitaxial growth, material deposition, etching processes, p- or n-type doping, soldering, and so on. Each CTC pixel of the CTC array 106 may comprise a photodiode, a reset gate, and a comparator. The photodiode may be any photodiode and may convert electromagnetic energy (e.g., light waves) into a current (e.g., a photocurrent). A strength of the photocurrent may depend on an intensity of incoming electromagnetic energy, such that brighter light results in a stronger photocurrent. The reset gate may comprise a switch configured to reset a CTC pixel to begin a detection period (e.g., by coupling/decoupling the CTC pixel from a voltage source). The comparator may be used to determine when a floating diffusion (FD) voltage reaches a predetermined threshold voltage, as discussed with reference to FIG. 3. Each CTC pixel may additionally include one or more capacitors, which may be referenced as a sense node/FD capacitor ($C_{FD}$). In some embodiments, the CTC is a MOS-PN (PN-type metal-oxide-semiconductor) hybrid device that directly converts light to time under low voltage.

A time-to-digital converter (TDC) array 108 may be provided on the bottom logic wafer 104, which may be positioned beneath, or otherwise stacked with, the top wafer 102. The top wafer 102 and the bottom logic wafer 104 may be separate wafers or may, in some cases, be opposite sides of the same wafer. The TDC array 108 may be coupled with the CTC array 106 through one or more communication pathways 116 such as, but not limited to, vertical transfer gates, through-silicon vias (TSVs), bond pads, and so on.

The TDC array 108 may comprise a number of individual TDC pixels. Each TDC pixel may comprise a static random-access memory (SRAM) that uses latching circuitry to store a bit of data. The number of latches in each SRAM may be any number depending on a desired resolution of each TDC pixel and each latch may correspond to a bit of data. In a non-limiting example, a SRAM for each individual TDC pixel comprises five latches, corresponding to five bits of data. An external counter may be additionally communicatively coupled with the TDC array 108 (e.g., to each TDC pixel) and a bi-directional data bus may transmit data (e.g., image data) to and from the external counter. The external counter may define a sampling rate at which a photocurrent (e.g., as generated from a photodiode) is sampled. Though an SRAM is discussed, any type of memory, such as a dynamic random-access memory (DRAM), may be used as a TDC pixel of the TDC array 108.

Each TDC pixel may be coupled to a respective CTC pixel, such that the number of TDC pixels and CTC pixels are equivalent. Furthermore, each TDC pixel and CTC pixel pair may form a pixel of the PWM image sensor 100 and may correspond to a pixel on an image generated by the PWM image sensor 100. In this way, a number of TDC/CTC pixel pairs may correspond to a maximum image resolution capable of being produced by the PWM image sensor 100. In a non-limiting example, if a potential maximum resolution of an image produced by the PWM image sensor 100 is 1792×828, there may be 1,483,776 TDC/CTC pixel pairs provided for the PWM image sensor 100. Though a particular example is provided, the number of TDC/CTC pixel pairs is not limited to any particular value and any number may be provided. As the TDC pixels and CTC pixels are arranged in a Z-direction, by stacking a bottom logic wafer 104 and a top wafer 102, a size of the TDC/CTC pixel pair may be reduced in an XY-plane.

Figure 1B:
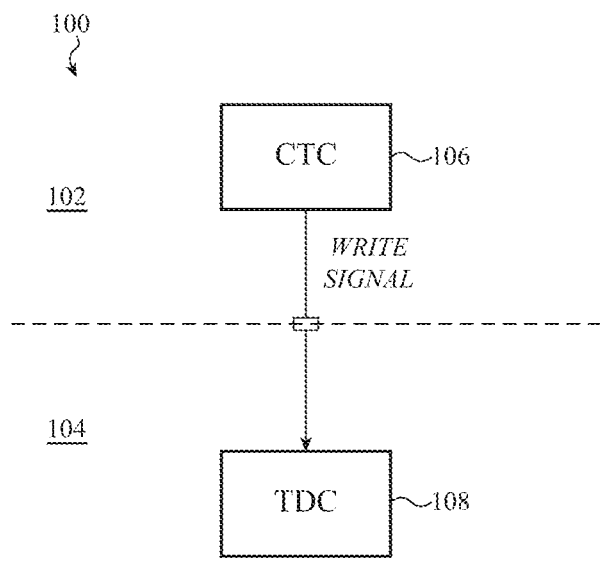

FIG. 1B depicts an example representation of a PWM image sensor 100 comprising a CTC array 106 stacked with a TDC array 108. As depicted in FIG. 1B, the CTC array 106 may be provided on a top wafer 102. The CTC array 106 may generate a signal (e.g., a WRITE signal) and may transmit the signal to the TDC array 108. The TDC array 108 may be provided on a bottom logic wafer 104. As depicted in FIG. 1A, the CTC array 106 and the TDC array 108 may be provided in a stacked arrangement.

Figure 1C:
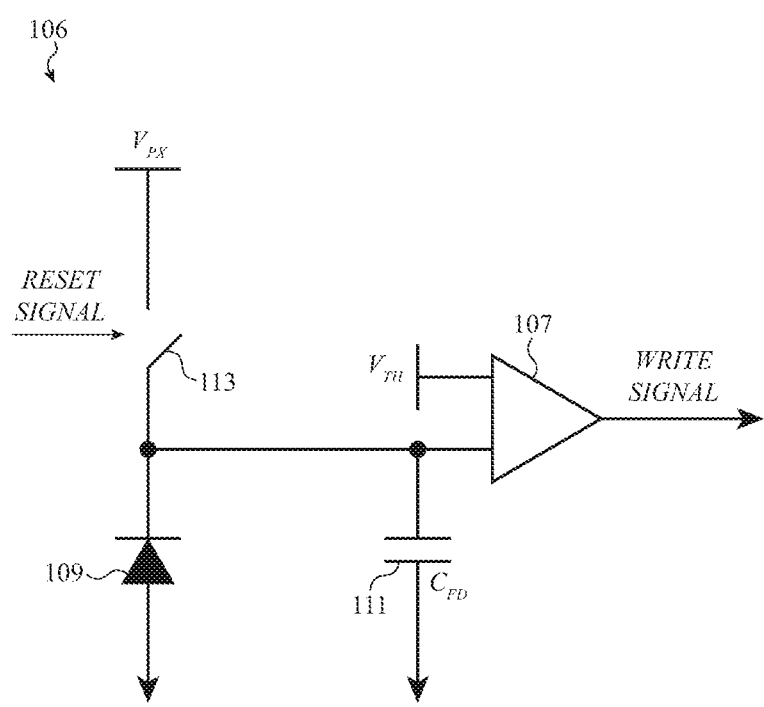

FIG. 1C depicts an example CTC circuit 106 in accordance with aspects of the provided disclosure. It is noted that the CTC circuit 106 is merely one example of a CTC circuit and any number of arrangements may be provided in accordance with the associated disclosure.

The CTC circuit 106 may include a comparator 107, a photodiode 109, a floating diffusion capacitor 111, and a reset gate 113. An operation of the CTC circuit 106 may begin in response to a RESET signal being applied to the reset gate 113. As depicted in FIG. 1C, a pixel voltage $V_{PX}$ may be provided and may be applied to the CTC circuit 106 when the reset gate 113 is closed and may be prevented from reaching components of the CTC circuit 106 when opened.

A photodiode 109 may additionally be provided and may use light (e.g., photons) to generate an associated photocurrent (e.g., a current). A strength of the photocurrent may depend on an intensity of the light as detected by the photodiode 109. The generated photocurrent may discharge the floating diffusion capacitor ($C_{FD}$) 111 to bias the input of the comparator 107. The comparator 107 may compare the incoming number of electrons with a threshold number of electrons. The threshold number of electrons may be established by inputting a threshold voltage Vth to the comparator 107. The threshold voltage Vth may be controllable and may be changeable (e.g., by a controller) to establish different triggering thresholds. Once a threshold number of electrons is reached at the comparator 107, a WRITE signal may be generated (e.g., to a TDC circuit).

Figure 2:
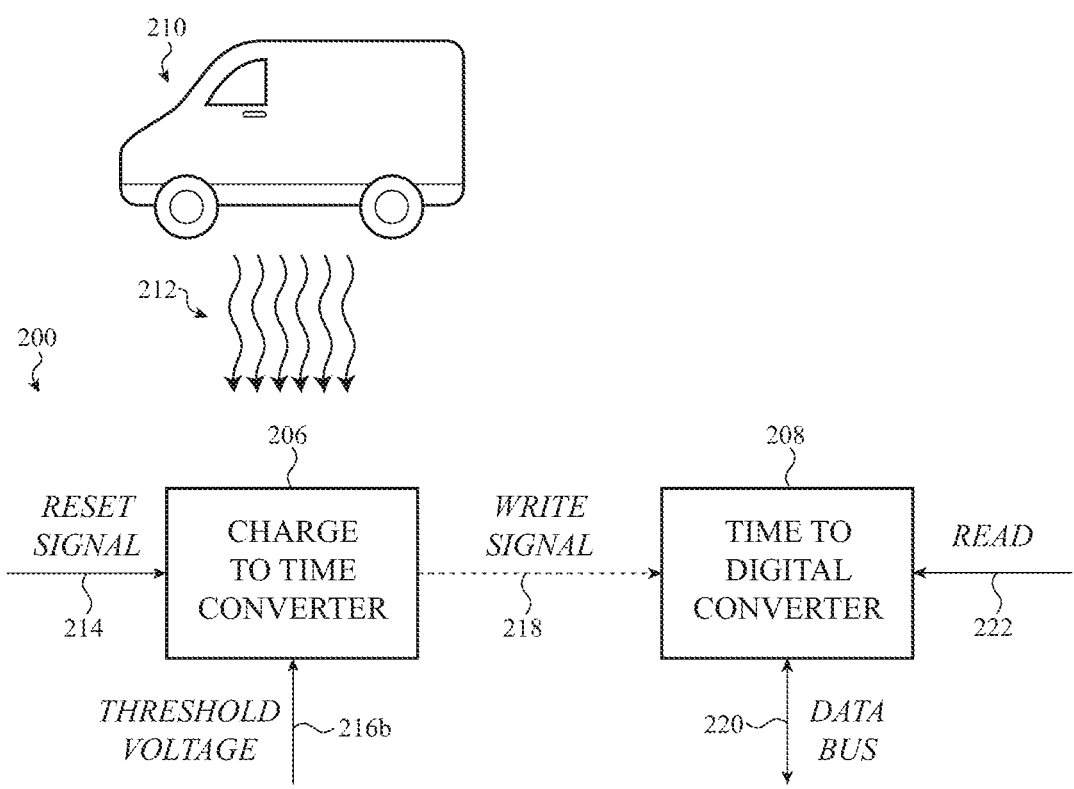
FIG. 2 depicts an example pixel of a PWM image sensor along with associated electronic components, as discussed herein.

FIG. 2 depicts example electronic components of a pixel 200 of a PWM image sensor. Particularly, in FIG. 2 a potential operation of a pixel 200 is discussed with additional reference to the timing diagram depicted in FIG. 3. While an operation with reference to one pixel is discussed, it is appreciated than a large number of individual pixels may be used in a PWM image sensor, such as in an array, as discussed with respect to FIG. 1A. Operations of different pixels may be identical or may vary depending on a photocurrent produced by a photodiode and/or on other potential settings, either analog or digital, of the PWM image sensor.

As discussed with respect to FIG. 1A, a pixel 200 of a PWM image sensor may comprise a CTC/TDC pixel pair. In particular, the charge-to-time converter (CTC) 206 may be positioned on a first wafer (e.g., a top wafer 102) and the time-to-digital converter (TDC) 208 may be positioned on a second wafer (e.g., bottom logic wafer 104) stacked with the first wafer. In some cases, the CTC 206 and the TDC 208 are positioned in alternate arrangements, such as on opposite sides of the same wafer. Additionally or alternatively, it is noted that the particular arrangement of the CTC 206 and the TDC 208 is not particularly limiting. Though FIG. 1A depicts a CTC stacked on top of a TDC, other arrangement may be used in accordance with the provided disclosure.

An operation of the pixel 200 will now be discussed with reference to both FIGS. 2 and 3. As noted above, FIG. 3 depicts a timing diagram of operations of a pixel of a PWM image sensor (such as the pixel 200) and, for ease of description, FIGS. 2 and 3 will be discussed in tandem.

As depicted in FIG. 2, a reset (RST) signal 214 may be applied to a CTC 206. The reset signal 214 may initiate the beginning of a detection period and may clear, or reset, electrons stored at a sense node and/or floating diffusion (FD). With reference to FIG. 3, a reset timing graph 252 depicts an operation of a RST signal 214. As depicted, the reset signal 214 may be binary (e.g., 1 and 0 and/or "on" and "off"). For example, the reset signal may be provided to the CTC 206 by the opening and closing of a switch, where one end of the switch is connected to the CTC 206 (e.g., a sense node/FD of the CTC 206) and another end of the switch is connected to a fixed voltage (e.g., a pixel voltage). Before a detection period is initiated, the switch may be closed, thereby supplying the pixel voltage to the CTC 206 to dissipate any electric charge which may be present at the sense node/FD (e.g., by prior image-detection operations). At a beginning of a detection period, at a time 230, the switch may be opened and the pixel voltage may be stopped. This may permit electrons to begin accumulation at a sense node/FD of the CTC 206. After an end of the detection period, the switch may be closed, depicted in FIG. 3 as between a triggering time 232 and an end of a frame time 234, thereby supplying the pixel voltage to dissipate the previous electric charge created by the accumulation of electrons. Subsequent detection periods may be initiated when the previous electric charge is completely dissipated and/or when the switch moves back to an open position, thereby stopping the pixel voltage from being applied to the sense node/FD of the CTC 206.

At a time 230, when the detection period begins as a result of the RST signal 214, a number of electrons 217a may begin to be accumulated at a sense node/FD of the CTC 206, as depicted in an electron timing graph 256. The electron timing graph 256 depicts the accumulation of electrons during the detection period. A voltage timing graph 254 depicts a voltage 216a of the sense node/FD, which corresponds with the number of electrons 217a. The number of electrons 217a may increase, at a rate dependent on a light intensity/photocurrent generated by a photodiode of the CTC 206, until a threshold number of electrons 217b is reached. Likewise, the voltage 216a may decrease until reaching a threshold voltage 216b. The time when the voltage 216a reaches the threshold voltage 216b and when the number of electrons 217a reaches a threshold number of electrons 217b may be referred to a triggering time 232.

The threshold voltage 216b may be established by supplying a preselected voltage to the CTC 206 as depicted in FIG. 2. In particular, the threshold voltage 216b may be applied to a first input of a comparator of the CTC 206. As a second input of the comparator of the CTC 206 may receive the voltage 216a, corresponding to a number of received electrons 217a accumulated at a sense node/FD of the CTC 206 during a detection period, the comparator may be capable of detecting when the voltage 216a matches the threshold voltage 216b, thereby resulting in a triggering time 232.

At the time 232, corresponding to an end of the detection period, a write (WRT) signal 218 may be generated at the CTC 206 and may be transmitted to the TDC 208. The WRT signal 218 may correspond to the accumulated number of electrons 217a over a particular time period, corresponding to a brightness of reflected light 212 from a scene and/or object which is the subject of an image (e.g., object 210). As depicted in the write signal graph 258, the WRT signal 218 initiates after the triggering time 232. The WRT signal 218 may correspond to initiating the process of latching a count in the TDC 208. A select timing graph 260 depicts a read signal 222 being applied to the TDC 208, as depicted in FIGS. 2 and 3. Each pixel (corresponding to a CTC/TDC pair) may be read row-by-row.

A time 234, signifying an end of a frame time, may correspond to a time when all detection and signal analysis processes are complete. For example, the image data of one or more pixels of a PWM image sensor may be fully processed at this stage and a subsequent process may initiate.

A data bus 220 may additionally be provided between the TDC 208 and an external counter (not depicted). The external counter may feed count data to the TDC 208 or may otherwise transmit and/or receive data from the TDC 208. Further description concerning the count data is described with reference to FIGS. 4-5.

Figure 3:
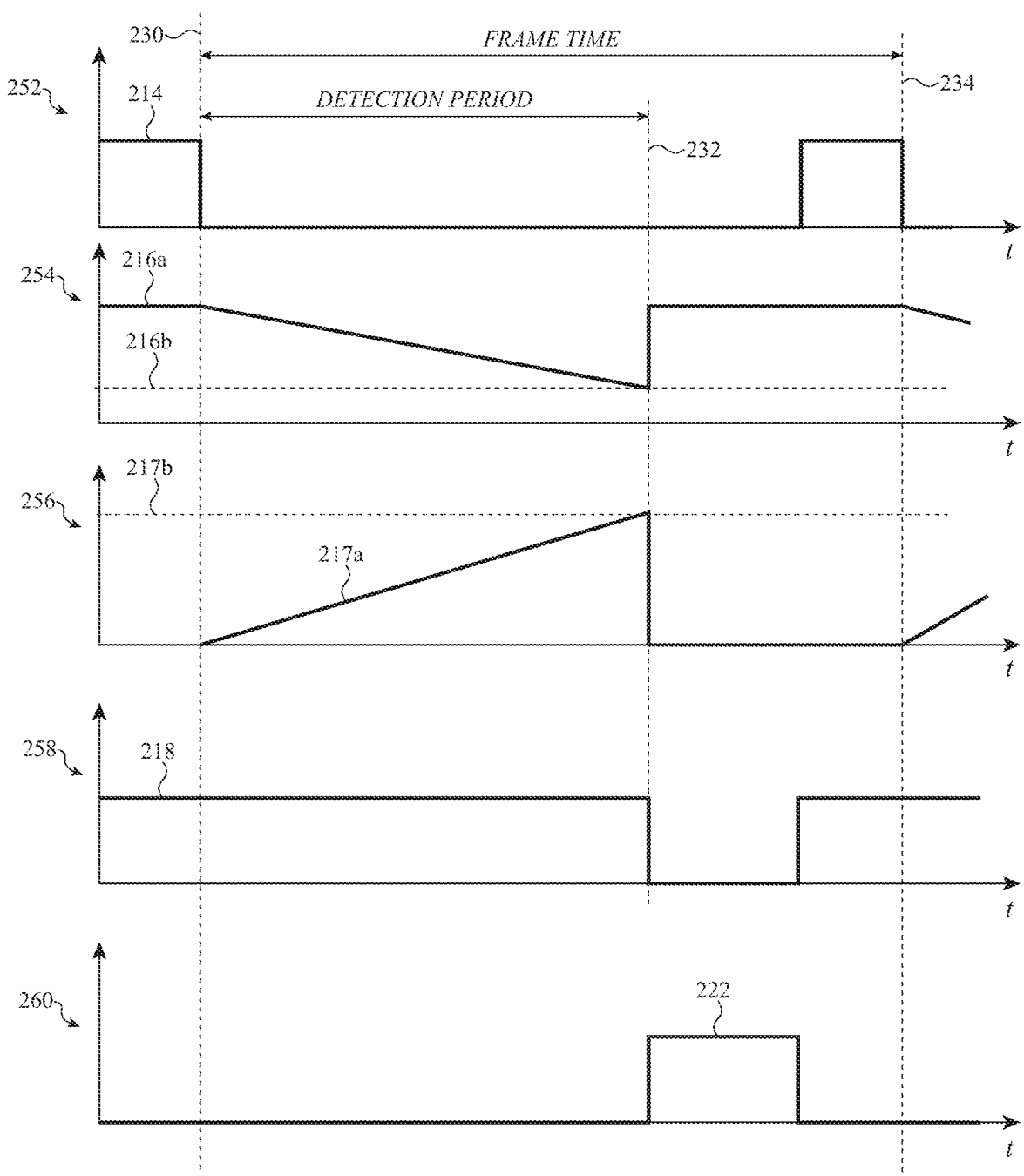
FIG. 3 depicts a timing diagram for components of an example PWM image sensor, as discussed herein.

An example operation in accordance with FIGS. 2-3 will now be provided. To initiate an image detection process, a reset signal 214 may be applied to a charge-to-time converter (CTC) 206. Light 212 reflected off of an object 210 may be received by the CTC 206 and a photodiode of the CTC 206 may convert the light 212 to a current (e.g., a photocurrent). The current may supply electrons to a sense node/floating diffusion where the electrons are accumulated. Once the accumulated electrons reach a threshold number of electrons (corresponding to a threshold voltage 216 supplied to the CTC 206), a write signal 218 corresponding to image information may be sent from the CTC 206 to a time-to-digital converter (TDC) 208. The write signal 218 may latch a count in the TDC 208 and the count may be read by a read signal 222. Any number of pixels of a PWM sensor may be read in any order (e.g., row-by-row) and image information of the object 210 may be generated. A bi-directional data bus 220 may additionally be provided between the TDC 208 and an external counter. The bi-directional data bus 220 may be bi-directional to conserve a pixel area, so as to further reduce a size of the pixel 200, though a unidirectional data bus may alternatively be used.

Figure 4:
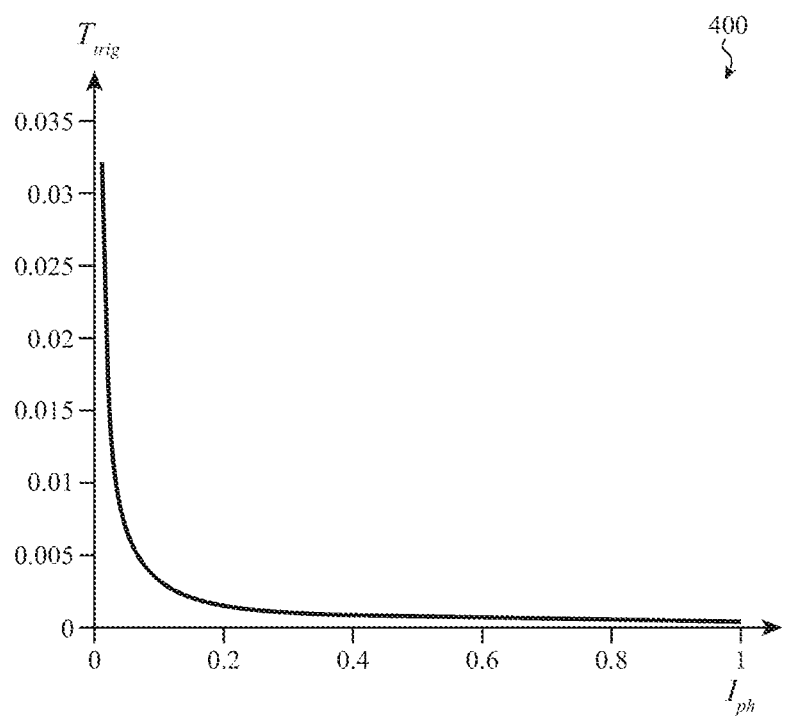
FIG. 4 depicts an example relationship between a photocurrent and a triggering time of a PWM image sensor pixel, as discussed herein.
Figure 5:
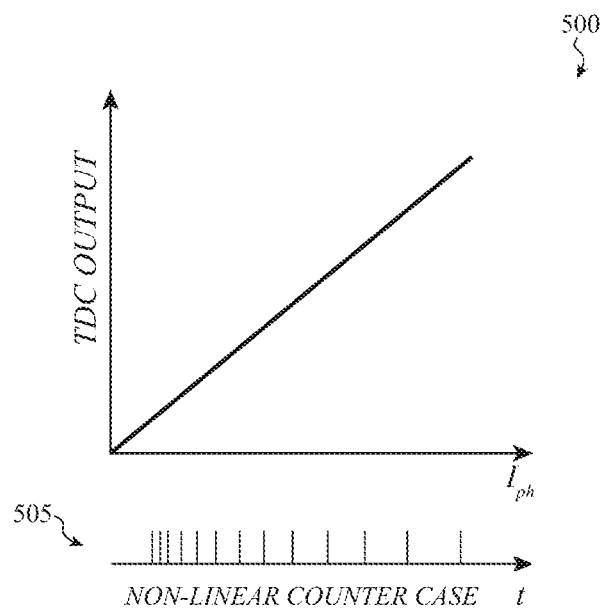
FIG. 5 depicts an example relationship between a time-to-digital converter (TDC) output and a photocurrent, in accordance with a non-linear sampling rate, as discussed herein.

FIGS. 4-5 depict graphs related to a non-linear counter, as discussed with reference to the external counter discussed with respect to FIGS. 2-3. FIG. 4 depicts a graph 400 showing a relationship between a photocurrent (e.g., a current produced by a photodiode in response to receiving light) and a triggering time (e.g., a time corresponding to a length of a detection period for a particular pixel of a PWM image sensor).

As can be seen in FIG. 4, as a photocurrent increases, an associated triggering time for a pixel of the PWM image sensor decreases. This occurs as a high photocurrent results in a high rate of electron accumulation at a sense node/FD of a CTC. As the electrons quickly accumulate at the sense node/FD, a triggering time may occur quickly. Conversely, a low photocurrent may result in a low rate of electron accumulation, thereby lengthening a necessary triggering time. Put simply, as the photocurrent increases the triggering time decreases, and, as the photocurrent decreases the triggering time increases. As depicted in FIG. 4, this relationship is not linear, but is instead curved between the X- and Y-axes. The curved line may be defined by the equation $$T_{trig} = \frac{q * N_{TH}}{I_{ph}},$$

where $T_{trig}$ is a triggering time (e.g., a length of a detection period for a particular pixel), q is an elementary charge (e.g., the charge of a proton), $N_{th}$ is a threshold number of electrons required to end a detection period, and $I_{ph}$ is a photocurrent produced by a photodiode of a CTC. As the terms are used herein, a triggering time may refer to a time when a particular pixel is triggered and a detection period may refer to a period when the entire PWM image sensor is active.

As indicated by the graph 400, a relationship between a photocurrent and a triggering time is non-linear. As such, if a linear sampling counter is used, highlights corresponding to a photocurrent at an end portion or a beginning portion of the curve may be compressed. That is, a linear counter having ticks separated by a consistent time would either compress the photocurrent sample above about 0.1 Amperes (A), as depicted in FIG. 4. This would result in a poor image quality for low- and/or high-light situations (resulting in highlight compression for pixels corresponding to relative bright/dark pixels).

To avoid potential highlight compression, an aspect of the provided disclosure provides a non-linear counter 505 to allow for a uniform sampling of a photocurrent. In this way, a relationship between a TDC output and a photocurrent may be linear, allowing for high quality highlight capture without compression within either low- or high-photocurrent ranges. Graph 500, as depicted in FIG. 5, depicts this linear relationship between the TDC output and the photocurrent, $I_{ph}$, in accordance with the non-linear counter 505. The non-linear counter 505 depicts the non-linear time between successive counter ticks, where high photocurrent is sampled at a faster rate than low photocurrent in accordance with a steeper photocurrent curve in a high photocurrent range, as depicted in FIG. 4.

In some cases, each tick of the non-linear counter 505 is separated by a time defined by the equation $$t = \frac{2^b * t_{min}}{2^b - n},$$

where b is a bit depth associated with a TDC, n is a counter step number, $2^b-n$ is the TDC counter code, and $t_{min}$ is the counter delay needed to detect a maximum possible photocurrent, $I_{max}$, producible by a photodiode of the CTC. The $I_{max}$ value may be based on physical properties of the photodiode used in the CTC and/or may be established by software associated with a PWM image sensor. In some cases, $t_{min}$ is defined by the equation $$t_{min} = \frac{q * N_{TH}}{I_{max}},$$

which is similar to the equation defining the curve in FIG. 4 with the exception that the current is a maximum possible photocurrent producible by a photodiode in the PWM image sensor rather than a detected photocurrent. It is additionally noted that the $t_{min}$ value is changeable based on changing a threshold number of electrons (e.g., by establishing different threshold voltages applied to the CTC).

Figure 6A:
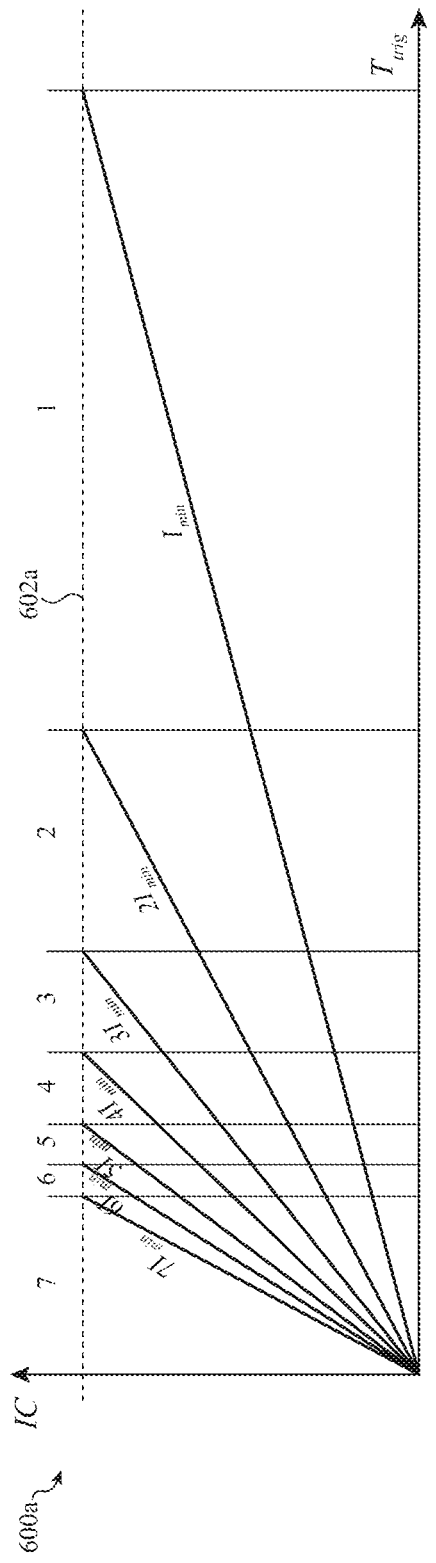
FIGS. 6A-6B depict example dynamic range extensions and, in particular, to relationships between time and integrated charges, as discussed herein.
Figure 6B:
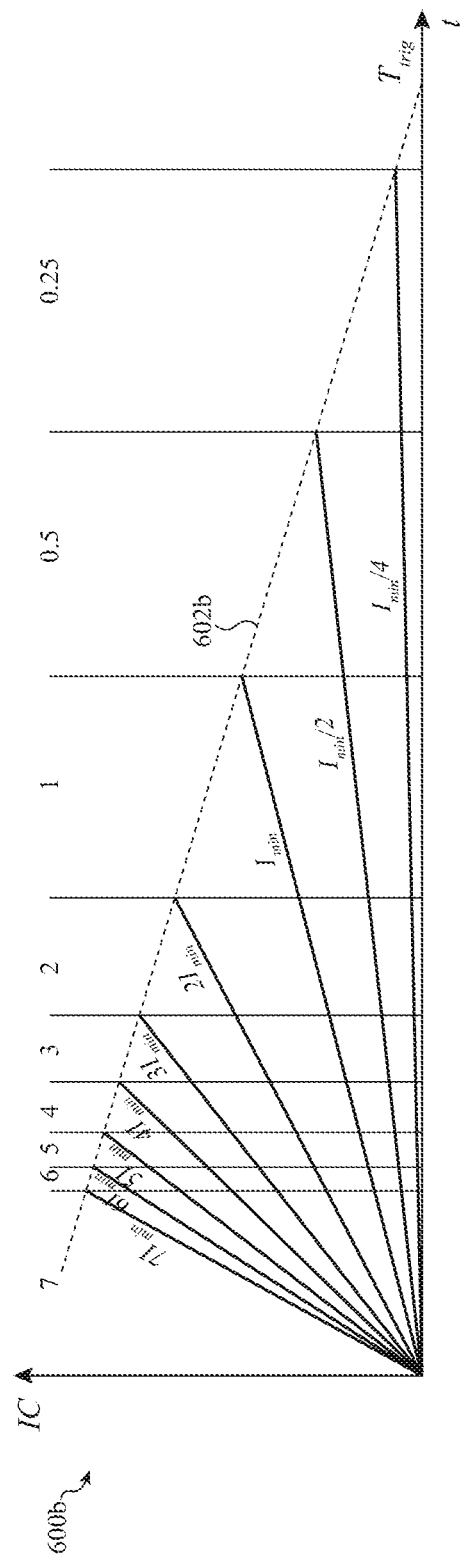

FIGS. 6A-6B depict graphs displaying example dynamic range (DR) extension. FIG. 6A depicts a graph 600a corresponding to DR extension with a constant threshold number of electrons ($N_{th}$) and FIG. 6B depicts a graph 600b corresponding to DR extension with a variable $N_{th}$. As the term is used herein, a "triggering time" refers to a moment when a threshold number of electrons has been accumulated at a sense node/FD for a particular pixel of a PWM image sensor. The triggering time is initiated when a detection period begins and occurs when a particular pixel is triggered.

As depicted in graph 600a, corresponding to a constant $N_{th}$, an integrated charge (IC) threshold 602a may be set to a constant value. During a detection period, a time (t) required to reach the IC threshold 602a depends on a value of a photocurrent produced by a photodiode in response to light. For example, as indicated by box '1' in graph 600a, a minimum photocurrent $I_{min}$ generated by a photodiode results in a triggering time $T_{trig}$, corresponding to a time when the number of electrons accumulated at a sense node/FD reaches the IC threshold 602a for a particular pixel. Similarly, a photocurrent of $4I_{min}$ produced by the photodiode, as indicated by box '4' in graph 600a, results in a second triggering time below the $T_{trig}$ value depicted in FIG. 6A, as the time required to reach the IC threshold 602a would be faster due to a faster accumulation of electrons at the sense node/FD. Likewise, respective triggering times would differ based on a value of a photocurrent produced by the photodiode, such as, but not limited to, photocurrents ranging from $I_{mm}$-$7I_{mm}$. In this way, a particular triggering time is based on the value of an associated current and a threshold number of electrons (e.g., an IC threshold 602a).

In some cases, the IC threshold 602a is the same across a number of pixels in a PWM image sensor. That is, a PWM image sensor may receive different amounts of light at different pixels, thereby causing respective photodiodes associated with respective pixels to generate different amounts of photocurrent. As such, a triggering time may differ for different pixels, based on a value of an associated photocurrent.

FIG. 6B depicts a graph 600b with a variable IC threshold 602b. As depicted in FIG. 6B, the variable IC threshold 602b may result in a lowered threshold number of electrons necessary to end a triggering period for a particular pixel of a PWM image sensor. In this way, smaller photocurrents (e.g., $I_{min}/4$) beneath a typical minimum photocurrent may be detectable without resulting in lengthy triggering times. For example, in FIG. 6B, a photocurrent of $I_{min}/4$ is depicted. If the IC threshold were at the level depicted in FIG. 6A, the IC threshold 602a, the triggering time required to reach a threshold number of electrons at a sense node/FD, would grow drastically. To reduce the triggering time, the IC threshold may be lowered.

However, if the IC threshold were lowered across each pixel of a PWM image sensor, valuable image data may be lost without much benefit (as a triggering time may already be small). For example, in high light states (e.g., resulting in a photocurrent of $7I_{min}$), a high percentage (e.g., 90+%) of electrons may be undetected if the IC threshold were set identically as it was set for low-light states (e.g., $I_{min}/4$). Additionally, the remaining electrons in high-light states may be capable of being received within a short time period, unlike low-light states.

The variable IC threshold 602b may be set manually (e.g., by a DR extension knob) or may be set automatically in response to detected light intensity levels. For example, if an electronic device is in a dark environment (as detectable by any number of sensors), the variable IC threshold 602*b* may be lowered.

The variable IC threshold 602*b* may differ across different pixels of a PWM image sensor. For example, pixels under high-light conditions (resulting in a high photocurrent) may have a relatively high IC threshold and pixels under low-light conditions (resulting in a low photocurrent) may have a relatively low IC threshold. In additional or alternative embodiments, an IC threshold may gradually decrease (e.g., at a constant rate) when the IC threshold has not yet been reached. In this way, an overall detection period may have an easily predictable end-point regardless of a value of an associated photocurrent and regardless of triggering times for individual PWM pixels.

Figure 7:
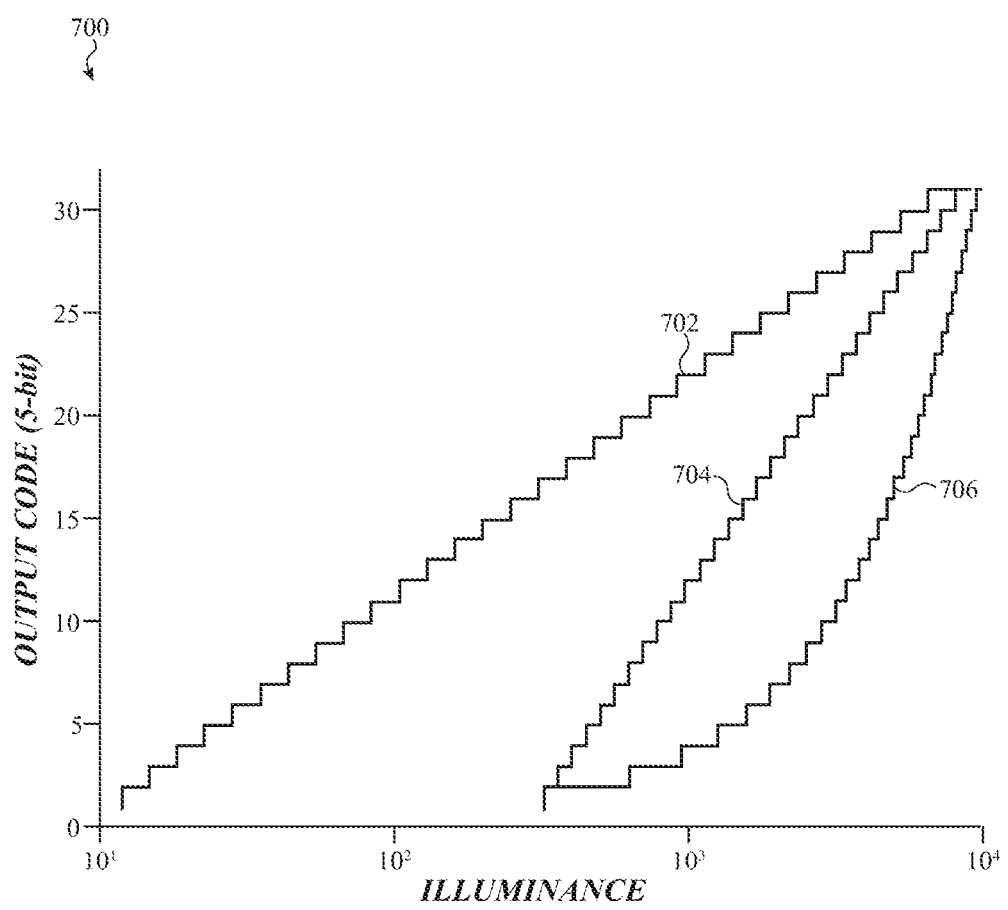
FIG. 7 depicts example TDC transfer functions in the time domain and, in particular, to relationships between a TDC output code and an illuminance, as discussed herein.

FIG. 7 depicts a graph 700 with various example TDC transfer functions. A TDC transfer function may refer to an encoding curve for an output curve based on an illuminance (measured in lux; 1×). In the graph 700, depicted in FIG. 7, transfer functions are depicted for a 5-bit output code (e.g., where a TDC can store 5 bits of information).

Curve 702 depicts a logarithmic TDC transfer function $f$ or a variable threshold number of electrons ($N_{th}$). Curve 704 depicts a logarithmic TDC transfer function $f$ or a constant $N_{th}$. Curve 706 depicts a linearizing TDC transfer function $f$ or a constant $N_{th}$. The particular transfer function used may be selected based on a specific application for which a PWM image sensor is used (e.g., depending on a light-condition of a camera, a video or picture mode, and so on). For example, curves 704 and 706 (representing TDC transfer functions) may be used for high light conditions where a minimum illuminance is above around 300 1×, though any value may be used in accordance with the provided disclosure.

The TDC transfer function may be controllable in the time domain by counter steps defined by the equation $t=f(n)*t_{min}$, where $t_{min}$ is a counter delay as described above. The function $f(n)$ may reference any linear, logarithmic, and/or piece-wise profile. As a non-limiting example of such a profile represented by $f(n)$, a logarithmic function may be defined by the equation $$f(n) = \frac{I_{max}}{I_{min} * 10^p},$$

where $I_{max}$ is a maximum photocurrent produced by a photodiode and $I_{min}$ is a minimum photocurrent produced by the photodiode. The value p may be defined by the equation $$p = \frac{n * \log_{10}(I_{max}/I_{min})}{2^b - 1},$$

where n is a range from 0 to $2^b-1$ and where b is a bit depth of the TDC (e.g., five in the example depicted in FIG. 7). In accordance with the provided disclosure, any equation may represent $f(n)$ including, but not limited to, the logarithmic equation represented above, in order to define a transfer function. In the above example, the logarithmic response may reduce or eliminate fixed-pattern noise (FPN) due to threshold variation of a current source (e.g., a current source transistor).

Each of the depicted TDC transfer functions, and any other suitable transfer function, may be used in a PWM image sensor. As discussed above, the transfer function flexibility for a PWM image sensor may allow the PWM image sensor to be specifically tailored toward particular application (e.g., an application on an electronic device) needs.

Figure 8:
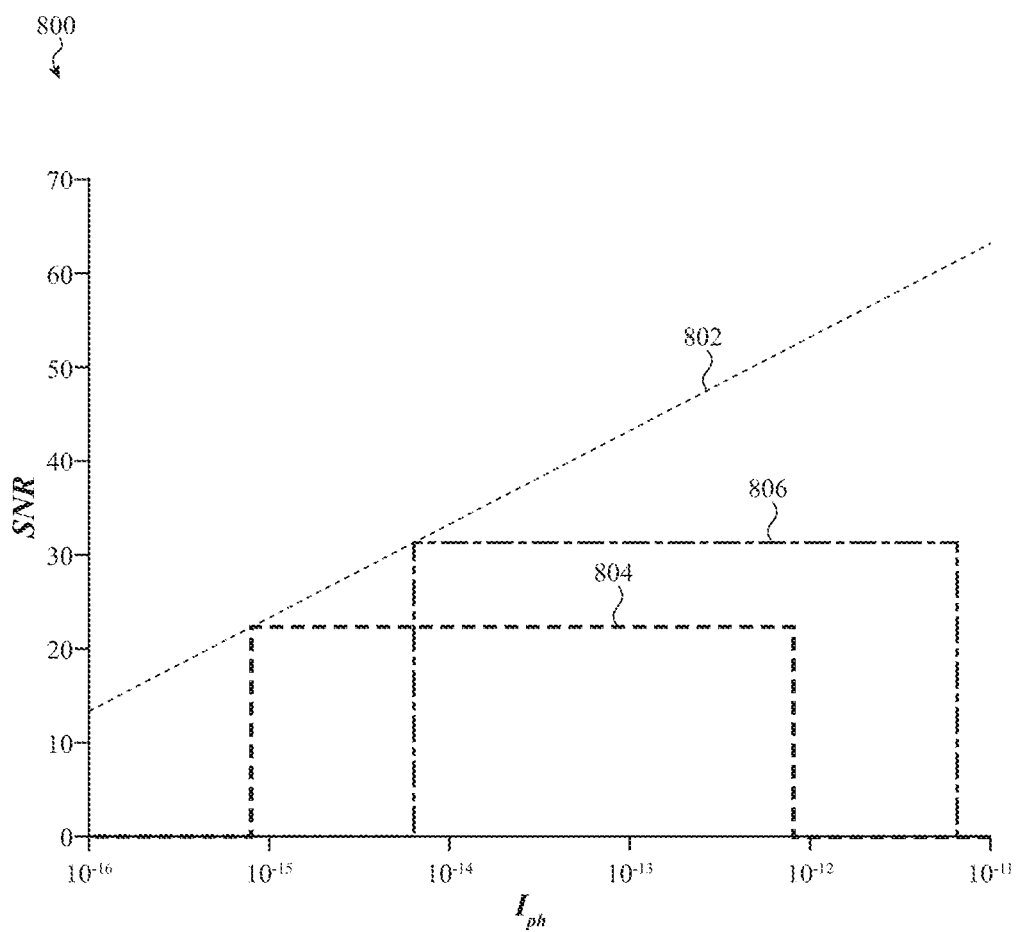
FIG. 8 depicts example relationships between photocurrent and a signal-to-noise ratio with respect to a photon noise limit, as discussed herein.

FIG. 8 depicts a graph 800 depicting a signal-to-noise ratio (SNR) for a first threshold number of electrons ($N_{th1}$; defined by curve 804) and a second threshold number of electrons ($N_{th2}$; defined by curve 806). The dashed line 802 may represent a photon shot noise, $N_{phot}$, in situations where the SNR is largely equivalent to the $N_{phot}$.

The SNR may be represented by the equation $$SNR = \frac{N_{phot}}{\sqrt{N_{phot} + N_{dark} + \sigma_q^2}},$$

where $N_{phot}$ is the photon shot noise, caused by statistical quantum fluctuations, $N_{dark}$ is dark noise, representing thermal noise from electron movement, and $\sigma_q^2$ is read noise, representing voltage fluctuations of a PWM image sensor (e.g., during a read process). In situations where the threshold number of electrons ($N_{th}$) is much higher than potential read noise and dark noise, the SNR is largely defined by the photon shot noise. This can result in the SNR being approximately equivalent to the square root of $N_{th}$, represented by line 802 as the photon noise limit.

As discussed above, the curve 804 represents a first threshold number of electrons ($N_{th1}$) and the curve 806 represents a second threshold number of electrons ($N_{th2}$). With reference to $N_{th1}$, a SNR may increase to the photon noise limit 802 as a photocurrent $I_{ph}$ is increased. However, once the photon noise limit 802 is reached, the SNR may remain consistent as other aspects of SNR (e.g., read noise) can be ignored as the values are overshadowed by the photon shot noise. This results in a system where SNR does not increase once a threshold level has been reached. At a higher threshold level, $N_{th2}$, the SNR may be larger than the corresponding SNR for $N_{th1}$, but may nevertheless remain consistent once the photon noise limit 802 has been reached, regardless of an increased photocurrent $I_{ph}$.

In this way, pixel saturation of any particular pixel of the PWM image sensor may be avoided and the highest detectable current (e.g., photocurrent) may be defined by the counter delay of the TDC. Further, in situations where the read noise is much less than the photon shot noise, a dynamic range of a PWM pixel may be determined by a ratio between a maximum triggering time $T_{trig}$ to a minimum triggering time $t_{min}$ as defined, in the case of constant $N_{th}$, by the equation $$DR = 20\log_{10}\left(\frac{T_{DET}}{t_{min}}\right) = 20\log_{10}(2^b),$$

where b is a bit depth of the TDC.

Figure 9A:
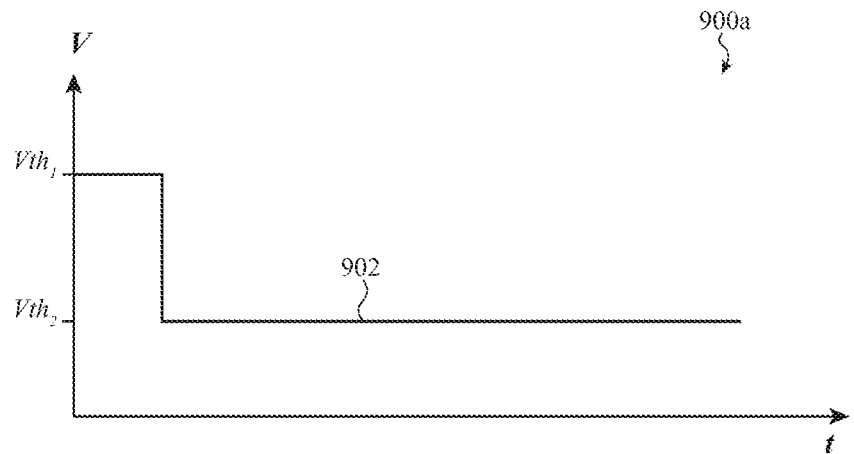
FIGS. 9A-9B depict an example of controlling a threshold number of electrons to extend a dynamic range of a pixel of a PWM image sensor, as discussed herein.
Figure 9B:
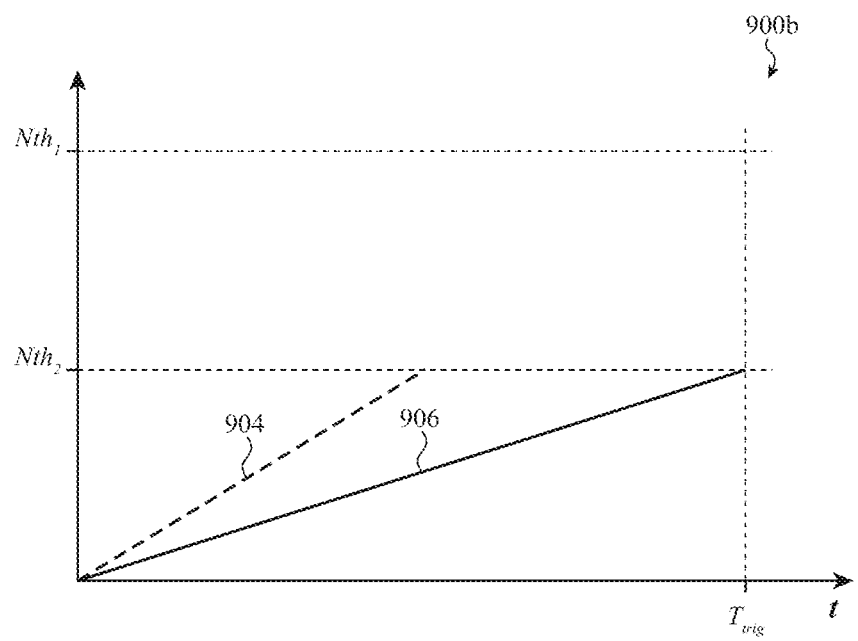

FIGS. 9A-9B depict graphs related to SNR shaping through the use of $N_{th}$ control. As discussed with respect to FIG. 8, above, a SNR value may be approximated as the square root of $N_{th}$, assuming that a photon shot noise dominates the overall noise of a SNR. To extend dynamic range, particular in low light conditions, a lower value of $N_{th}$ may be selected during a detection period, if a threshold number of electrons is not accumulated in a sense node/FD within a particular period of time. This may allow a faster detection period, as otherwise particular pixels may require a large amount of time to accumulate the threshold number of electrons and/or may blur an image if the image sensor is in motion relative to a scene and/or object that is the subject of an image.

With reference to FIG. 9B, depicting a graph 900b, a first threshold number of electrons $N_{th1}$ and a second threshold number of electrons $N_{th2}$ are depicted. Within a particular detection period, a photocurrent defined by line 904 may be expected to reach $N_{th1}$ at a triggering time $T_{trig}$ with respect to a particular pixel. However, in low-light situations, a lower photocurrent may be produced by a photodiode and a triggering time may be reached at a slower rate, as defined by line 906. To avoid lengthy triggering times, the $N_{th}$ value may be lowered. As discussed herein, $N_{th}$ may be lowered by lowering a threshold voltage applied to a CTC. A $N_{th}$ value may additionally or alternatively be lowered in other ways, such as decreasing a capacitance of a sense node/FD capacitor or having a double conversion gain structure.

FIG. 9A depicts a reduction of a $N_{th}$ value by reducing a voltage applied to a CTC. As depicted in graph 900a, a voltage 902 is reduced from a $V_{th1}$ value to a $V_{th2}$ value after a certain time period has elapsed. As a result, the triggering time may conclude (indicated by $T_{trig}$) when a $N_{th2}$ value is reached, instead of an initial $N_{th1}$ value (see FIG. 9B). By ramping down $N_{th1}$ n this way, SNR may additionally be controlled, as SNR may be approximated as the square root of $N_{th}$. This may allow SNR shaping when using a PWM sensor.

Figure 10A:
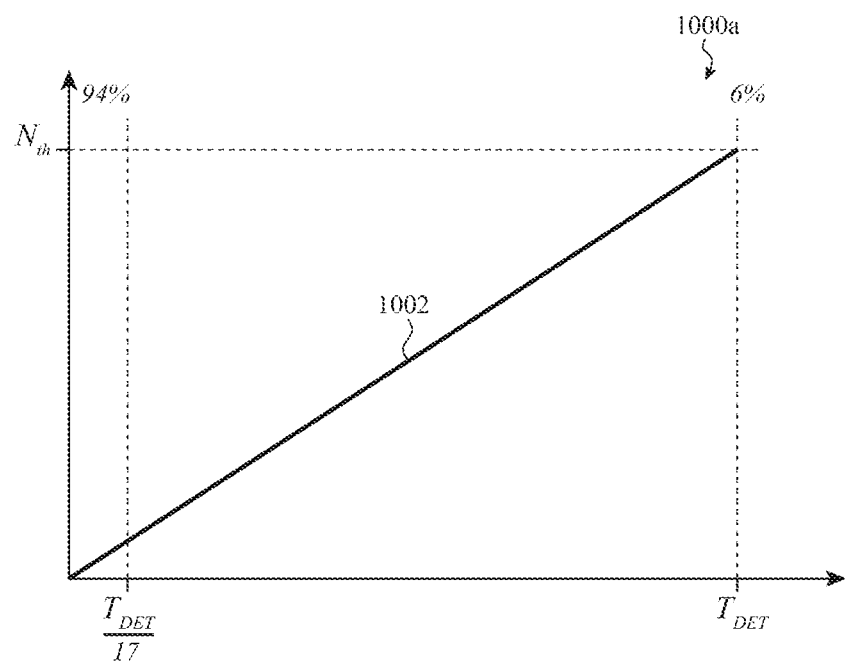
FIGS. 10A-10B depict example shutter performances of a PWM image sensor, as discussed herein.
Figure 10B:
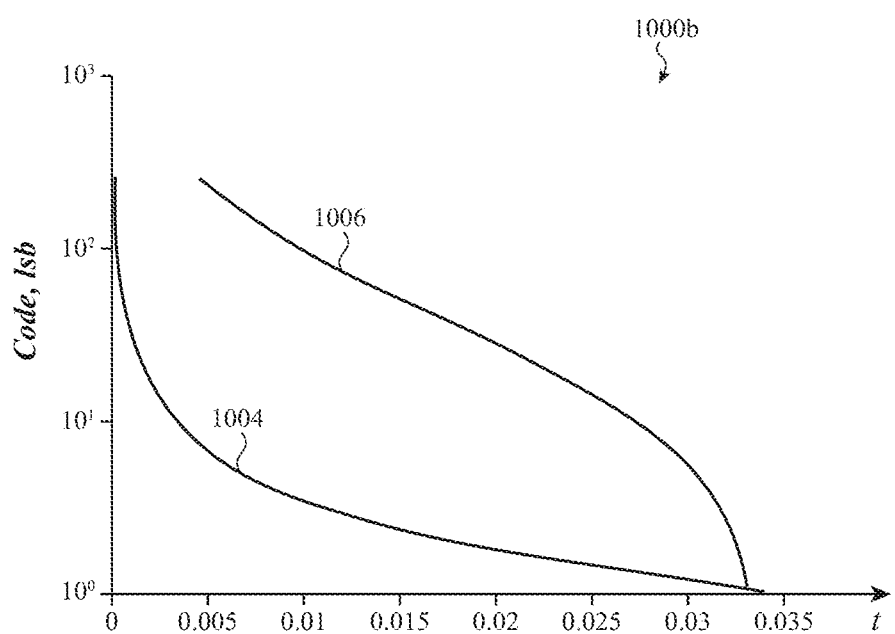

FIGS. 10A-10B depict graphs corresponding to different detection periods for a number of pixels of a PWM image sensor. As discussed above, different pixels may receive different amounts of light resulting in respective photocurrents having different values. Therefore, different pixels may reach a threshold number of electrons ($N_{th}$) at different times. In traditional image sensors, this may result in a blurry image for fast-moving objects (e.g., an object may be in a different position at the beginning of a detection period when compared to an end of the detection period).

As depicted in graph 1000a of FIG. 10A, motion blur may be minimized for a PWM image sensor as a majority of all pixels may reach a $N_{th}$ value within a short period of time. In the example depicted in graph 1000a, for example, 94% of all pixels are triggered within a triggering time corresponding to $T_{DET}/17$. The remaining 6% of pixels (e.g., pixels where an associated photocurrent has a value of $I_{min}$ as depicted by line 1002) may be triggered within a triggering time corresponding to $T_{DET}$. Through this control, motion blur of a resulting image may be minimized, or eliminated, particularly for pixels generating a large photocurrent. This is due to at least 94% of the pixels comprising an image reaching a triggering time within a very small window (e.g., $1/17^{th}$ of an overall detection time). A sharper image, therefore, may result.

FIG. 10B depicts a graph 1000b depicting a relationship between a TDC code (e.g., a TDC code in least significant bits (1 sb) units) and time (t). Line 1004 depicts an example of constant $N_{th}$ where a threshold number of electrons remains consistent across one or more pixels and/or across a detection period. Line 1006 depicts an example of ramped $N_{th}$ where a threshold number of electrons changes across one or more pixels and/or across a detection period (see, e.g., FIGS. 9A-9B). Due to the faster conversion curve of line 1004 (representing a constant $N_{th}$ case), a higher number of pixels may be triggered in a shorter period of time. In contrast, the slower conversion curve of line 1006 (representing a ramped $N_{th}$ case), may result in slower triggering times. As such, a conversion curve corresponding to the line 1004 may represent a sharper image, when compared to the conversion curve corresponding to line 1006.

Figure 11:
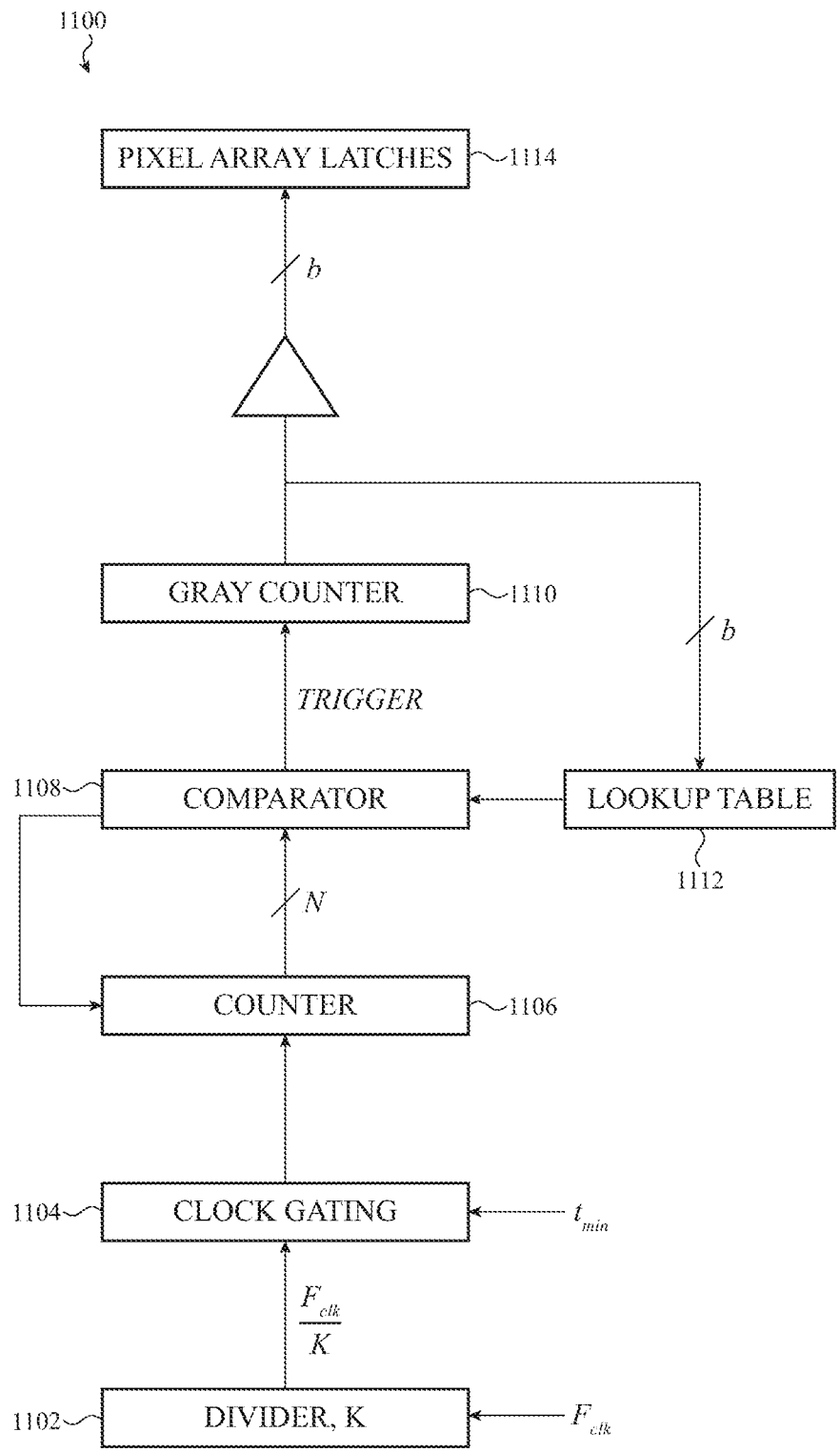
FIG. 11 depicts an example flowchart of TDC timing control, as discussed herein.

FIG. 11 depicts an example structure 1100 for TDC timing control of a PWM image sensor. For a particular PWM image sensor, a resolution of the time-to-digital conversion (e.g., by a TDC) may be given by $$\Delta I = \frac{I_{max}}{2^b - 1},$$

where $I_{max}$ is a maximum photocurrent of a photodiode and b is a bit depth of a TDC. Using the resolution, a smallest time step may additionally be given by:

$$\Delta t = \frac{q * N_{th}}{I_{max} - \Delta I} - \frac{q * N_{th}}{I_{max}} = \frac{t_{min}}{2^b - 2},$$

where $N_{th1}$ s a threshold number of electrons collected as a sense node/FD, q is an elementary charge (e.g., the elementary charge of a proton), and $t_{min}$ is a counter delay. Using the smallest time step $\Delta t$, a clock frequency Falk may be additionally given by $$F_{clk} = \frac{1}{\Delta t}.$$

As depicted in the example structure 1100, a clock frequency $F_{clk}$, as defined in the previous paragraph, may be scaled down from a maximum photocurrent, $I_{max}$, by a clock division coefficient K, referenced as divider 1102. The clock frequency may be proportional to the maximum photocurrent. In cases where a maximum photocurrent is expected (e.g., for a highest amount of measurable light), K may be equivalent to the value '1.'

The clock frequency divided by the clock division coefficient may be applied to a clock gating 1104. The clock gating 1104 may be used to save power, so that an associated clock circuit is not operated while not currently in use. By applying the clock frequency and clock division coefficient to the clock gating, the clock may be activated. A counter delay may additionally be provided to the clock gating 1104. A counter 1106 (e.g., a non-linear counter as discussed with respect to FIGS. 4-5) may sample a photocurrent produced by a photodiode and a comparator 1108 (e.g., a digital comparator) may be used to determine when a number of electrons accumulated at a sense node/FD reaches a threshold number of electrons (e.g., by a threshold voltage input into the comparator 1108).

As depicted in FIG. 11, the TRIGGER signal may be a non-linear synchronization signal for the gray counter 1110. The counter 1106, the comparator 1108, and the lookup table 1112 may be used to generate the TRIGGER signal. That is, the lookup table 1112 may hold clock division values for every TDC count within a particular range (e.g., 1 to $2^b-1$), the comparator 1108 may compare the counter 1106 value with the present value from the lookup table 1112, and the TRIGGER signal may be generated when the two values correspond. The comparator 1108 may additionally send a reset signal to the counter 1106. The divider 1102 may additionally be used to affect a speed of the gray counter 1110 and may control an exposure or detection time of an associated PWM image sensor. In some implementations, such as in a ramped $N_{th}$ mode, the lookup table 1112 may additionally hold $N_{th}$ values for every TDC count.

FIG. 11 merely discusses one manner of TDC timing control, and any number of TDC timing control methods may be used in accordance with a PWM image sensor of the provided disclosure. A number of such examples are provided in FIGS. 12-15B.

Figure 12:
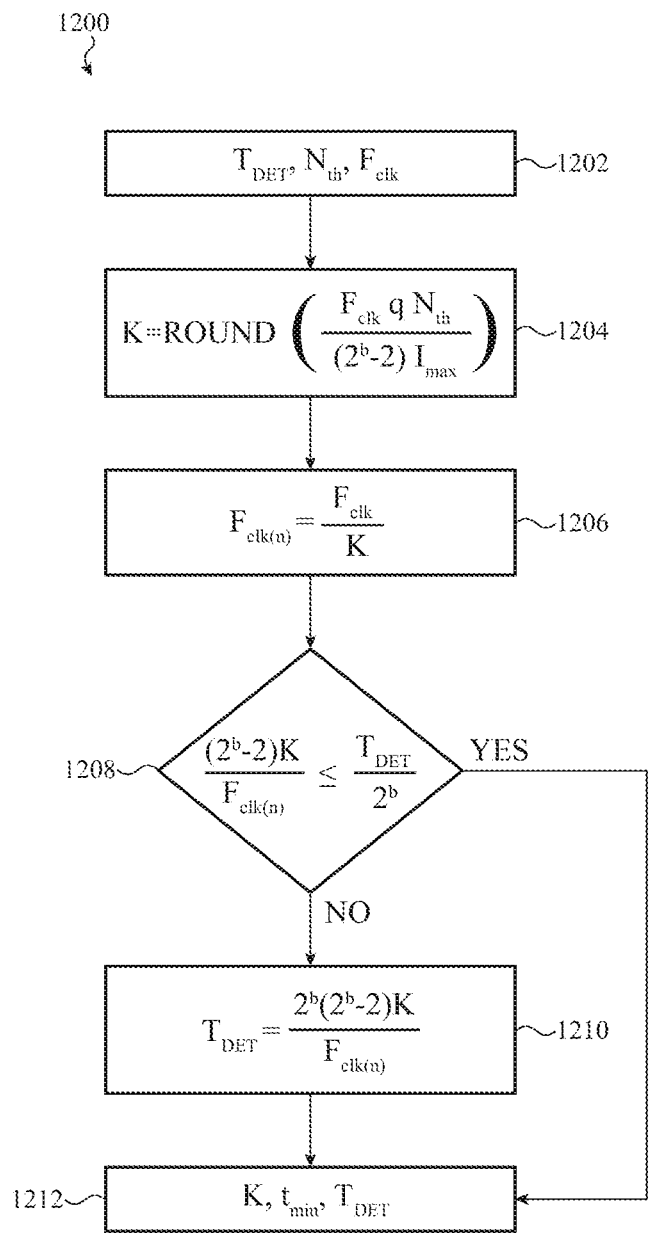
FIG. 12 depicts an example flowchart of exposure control utilizing a maximum photocurrent and a threshold number of received electrons, as discussed herein.
Figure 13:
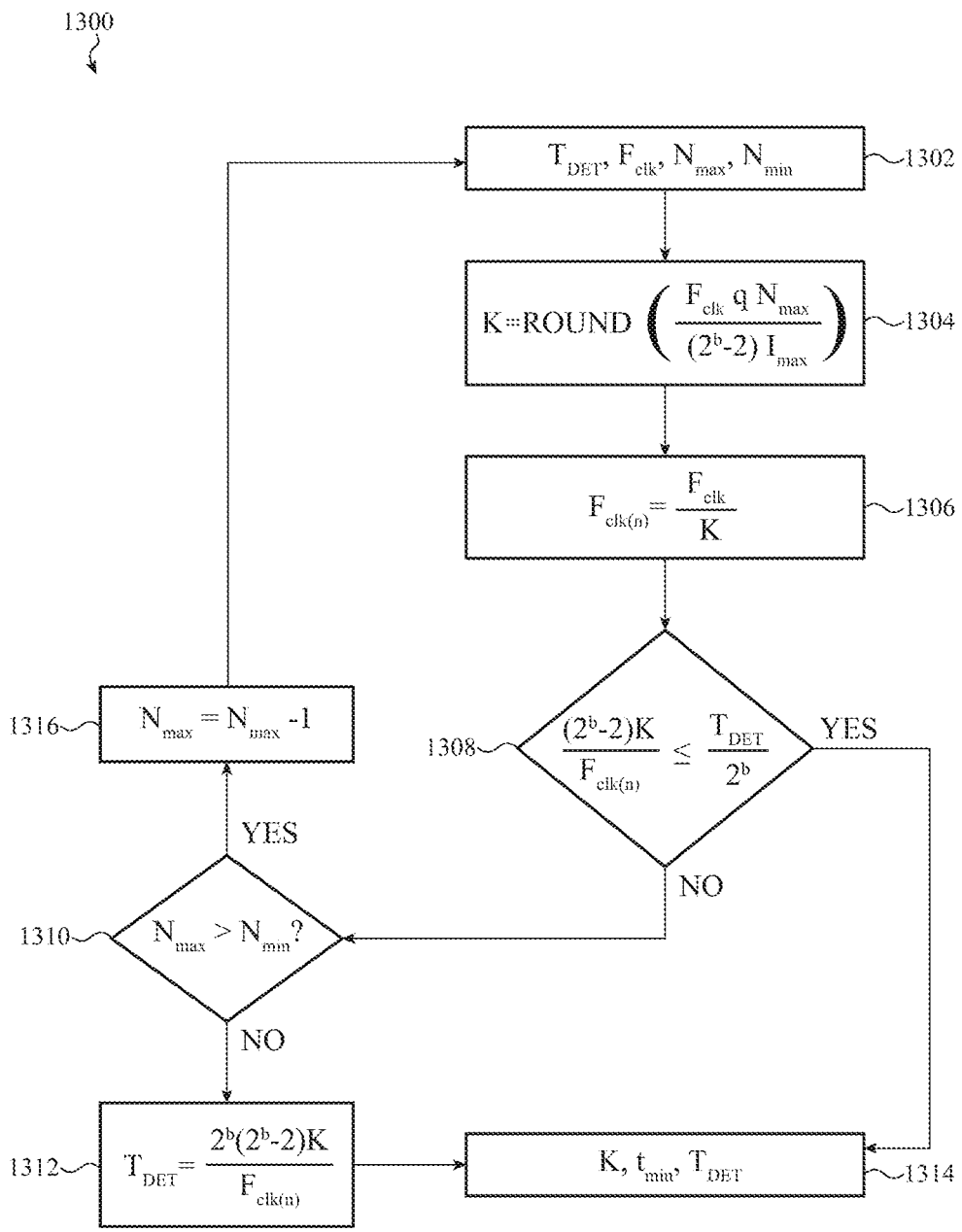
FIG. 13 depicts an example flowchart of exposure control utilizing a maximum photocurrent and a maximum number of received electrons, as discussed herein.

FIG. 12 depicts an example method 1200 of exposure control where an initial $N_{th}$ value is predetermined by a SNR expectation and FIG. 13 depicts an example method 1300 of exposure control where a maximum value of $N_{th}$ (e.g., $N_{max}$) is used.

As depicted at operation 1202, initial values for a detection period, $T_{DET}$, a threshold number of electrons, $N_{th}$, and a clock frequency, Folk, may be used as a starting point for an exposure control. These initial values may correspond to an expected SNR and/or by a range of photocurrent expected in an object/scene which is the subject of an image captured by a PWM image sensor.

At operation 1204, a value for the clock division coefficient K may be calculated. As discussed above with respect to FIG. 11, the clock division coefficient may be used as a scaling factor to scale the clock frequency down from a maximum level (e.g., a level corresponding to a maximum photocurrent). As depicted at operation 1204, the value for K may be calculated from the equation $$K = \text{ROUND}\left(\frac{F_{clk}qN_{th}}{(2^b-2)I_{max}}\right),$$

where the function ROUND rounds the calculated value to the nearest whole number. The ROUND function may additionally or alternatively round up or round down.

At operation 1206, a new clock frequency is determined by dividing the original clock frequency (e.g., as indicated at operation 1202) by the value for K as determined at operation 1204. At operation 1208, a determination is made using the new clock frequency. The determination is whether a detection period, divided by 2 to a power corresponding to a bit depth of a TDC, is greater than or equal to the expression $$\frac{2^b(2^b-2)K}{F_{clk(n)}}.$$

In other words, a determination is made as to whether a conversion time is less than or equal to a detection period.

If the operation at 1208 is answered in the negative ("NO"), then the detection period may be changed to the conversion time as indicated at operation 1210. If the operation at 1208 is answered in the positive ("YES"), then the detection period may remain the same. In the case of operation 1210, the low light detection time may be extended to reduce a frame rate of a PWM pixel. At operation 1212, values for K, $t_{min}$, and/or $T_{DET}$ may be determined and/or stored (e.g., in a lookup table). As described herein, the method 1200 depicted in FIG. 12 generally corresponds to a one shot scene estimate in a logarithmic mode (e.g., a logarithmic transfer function).

FIG. 13 depicts an alternate method 1300 of exposure control. As indicated at operation 1302, a maximum 'N' value (e.g., a threshold number of electrons accumulated at a sense node/FD) may be used as a starting point for exposure control. In contrast, the method 1200 depicted in FIG. 12 uses a predetermined $N_{th}$ value using a SNR expectation (e.g., based on a one shot estimate).

At operation 1302, initial values for a detection period ($T_{DET}$), a clock frequency ($F_{clk}$), a maximum number of accumulated electrons ($N_{max}$), and a minimum number of accumulated electrons ($N_{min}$) may be obtained. At operation 1304, a clock frequency division coefficient K may be calculated. The equation depicted at operation 1304 may be the same as that depicted in operation 1204, with reference to FIG. 12, with the exception that a maximum threshold number of electrons, $N_{max}$, value is used instead of a threshold number of electrons $N_{th}$ as based on a one shot estimate.

At operation 1306, the calculated clock frequency division coefficient K may be used to update a clock frequency value, as indicated by $F_{clk(n)}$. In this way, a clock frequency coefficient corresponding to a maximum threshold level of electrons may be calculated. In some cases, the value for 'K' at this initial step is equal to '1.'

At operation 1308, a determination is made as to whether a conversion time is less than or equal to a detection period. If the conversion time is not less than or equal to the detection period (e.g., "NO"), then the method may proceed to operation 1310 where it is determined whether a $N_{max}$ value is greater than a $N_{min}$ value. If $N_{max}$ is greater than $N_{min}$ ("YES" at operation 1310), the $N_{max}$ value may be reduced by '1' and may be used as a new $N_{max}$ value at operation 1302 and onwards. In this way, exposure control may be performed incrementally.

If, at operation 1310, the $N_{max}$ value is less than the $N_{min}$ value, then the method 1300 may continue (via "NO") to operation 1312, where a detection period is calculated using the same formula as provided at operation 1210 in FIG. 12. Values for K, $t_{min}$, and $T_{DET}$ may then be obtained and/or stored at operation 1314.

If, at operation 1308, a detection period is greater than or equal to the conversion time, the method 1300 may proceed immediately to operation 1314, where values for K, $t_{min}$, and $T_{DET}$ may be obtained and/or stored. In this way, the method 1300 may be used to reduce a threshold number of electrons down to a minimum level ($N_{min}$) before decreasing a frame rate (e.g., at operation 1312). Method 1300, therefore, may generally use a step-by-step approach to control a particular exposure value.

Figure 14:
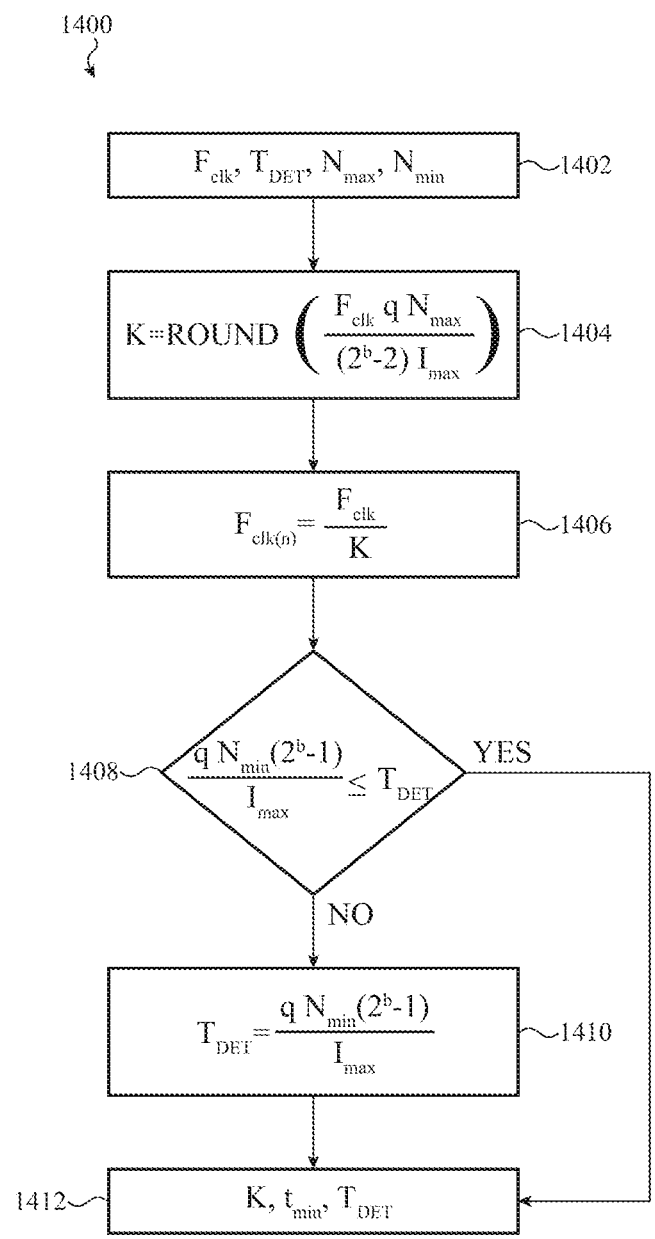
FIG. 14 depicts an example flowchart of exposure control in a ramped mode, as discussed herein.

FIG. 14 depicts an additional method 1400 of exposure control in a ramped $N_{th}$ mode (e.g., a mode as depicted in FIGS. 9A-9B). In the ramped $N_{th}$ mode, the $N_{max}$ and $N_{min}$ values are constant and, therefore, there is no need to change associated values in a lookup table (LUT), as depicted in FIG. 13.

At operation 1402, initial values for a clock frequency ($F_{clk}$), a detection period ($T_{DET}$), a maximum threshold number of electrons ($N_{max}$), and a minimum threshold number of electrons ($N_{min}$) may be obtained. At operation 1404, a clock frequency division coefficient K may be calculated using a charge q, the clock frequency, a maximum threshold number of electrons, and a maximum photocurrent, as discussed above. At operation 1406, an updated clock frequency may be obtained by dividing the original clock frequency by the clock frequency division coefficient K.

At operation 1408, a determination is made as to whether a detection period ($T_{DET}$) is greater than or equal to a conversion time, as defined by the equation $$\frac{qN_{min}(2^b - 1)}{I_{max}} \leq T_{DET}.$$

If the detection period is greater than or equal to the conversion time, the method 1400 may proceed to operation 1412 where values for K, $t_{min}$, and $T_{DET}$ may be obtained. If operation 1408 is answered in the negative (e.g., "NO"), a frame rate may be changed by changing a detection period in accordance with the equation $$T_{DET} = \frac{qN_{min}(2^b - 1)}{I_{max}}.$$

After the detection period is changed, the method 1400 may proceed to operation 1412, as discussed above.

Figure 15A:
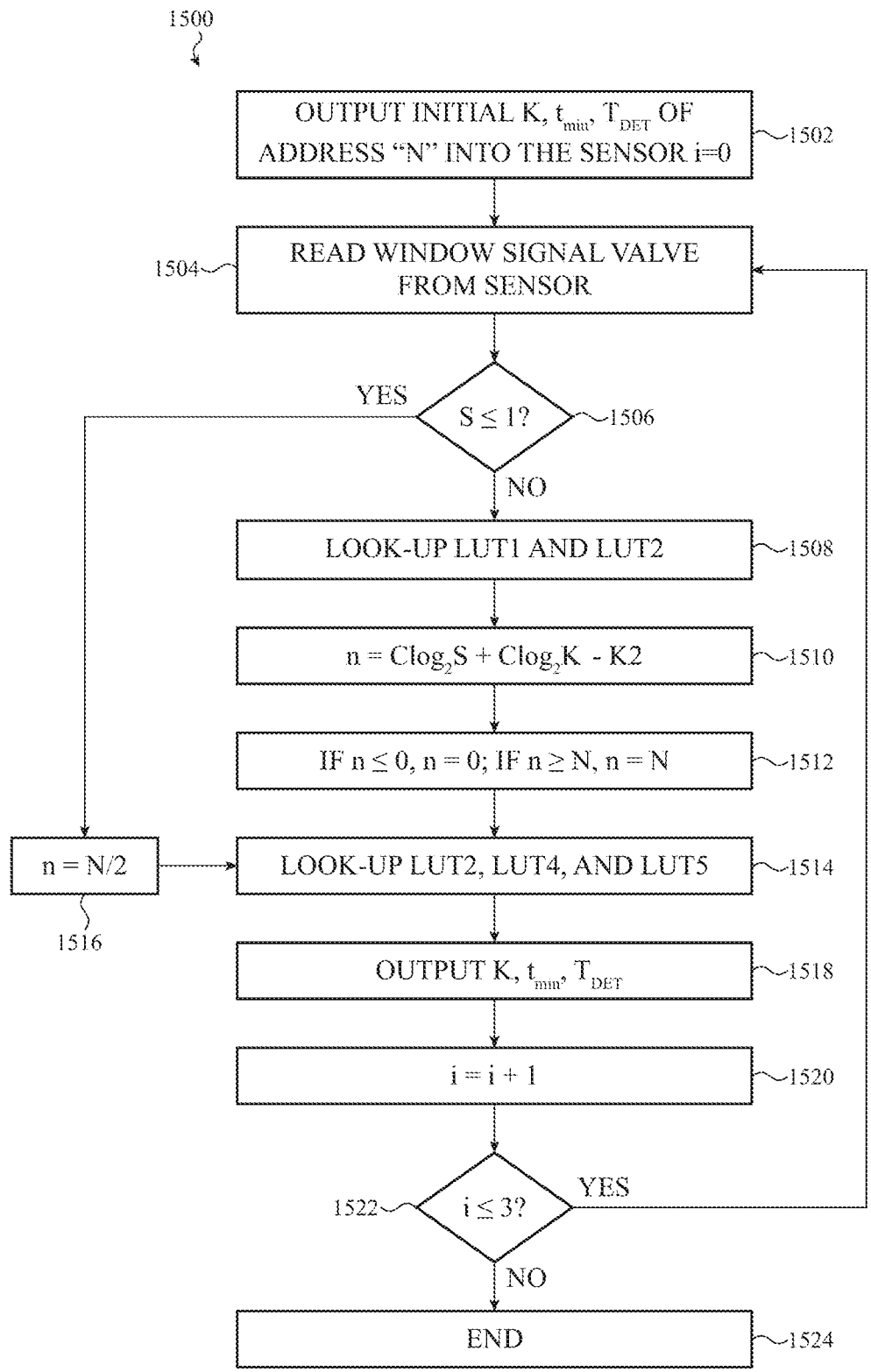

FIGS. 15A-15B depict examples of an auto-exposure process. FIG. 15A depicts a method 1500 of an auto-exposure process using a system-on-a-chip lookup tables (SOC LUT). At operation 1502, initial values for K, $t_{min}$, and $T_{DET}$ are input from address 'N' of a LUT associated with a PWM image sensor at i=0. At operation 1504, a window signal value may be obtained from the PWM image sensor and a mean brightness S may be calculated. To calculate S, the equation $$S = \frac{I_{ph}(2^b - 1)}{I_{max}}$$

may be used, where $I_{max}$, is directly proportional to a TDC clock frequency and is defined as $$I_{max} = \frac{qN_{max}F_{clk}}{(2^b - 2)K},$$

where q is an elementary charge, $N_{max}$ is a maximum threshold number of electrons received at a sense node/FD, $F_{clk}$ is a clock frequency of the TDC, b is a bit depth of the TDC, $I_{ph}$ is the mean photocurrent, and K is a division coefficient. The equation for mean brightness S may be simplified as $$S = k1 * L * \frac{K}{F_{clk}},$$

where k1 is a constant value.

At operation 1506, a determination whether the mean brightness is less than or equal to '1' is made. If the mean brightness is larger than '1,' a lookup table (LUT) may be queried to obtain data for C $\log_2 S$ and C $\log_2 K$ at operation 1508, which, in the embodiment depicted in FIGS. 15A-15B, correspond to LUT1 and LUT3 (see LUT 1550 as depicted in FIG. 15B). Though LUT1 and LUT3 are queried at operation 1508, any LUT column may store the necessary information according to particular LUT settings.

Once values from LUT1 and LUT3 are received at operation 1508, a counter step number n may be calculated, at operation 1510, by the equation n=C $\log_2 S$+C $\log_2 K$−K2, where n is the counter step number, C is defined by the equation $$C = \frac{N - 1}{\log_2 L_{max} - \log_2 L_{min}},$$

and K2 is defined by the equation K2=C $\log_2 L_{min}$−C $\log_2 F_{clk}$+C $\log_2 k1$. As used herein, the values for illuminance (L) may be derived from the equation $\log_2 L = \log_2 S - \log_2 K + \log_2 F_{clk} - \log_2 k1$ and minimum and maximum values for illuminance may be given by $$L_n = \left(\frac{L_{max}}{L_{min}}\right)^{\frac{1}{N-1}} L_{n-1},$$

where Ln is the window illuminance.

At operation 1512, the calculated value for n is used. For example, as depicted at operation 1512, if n is less than or equal to 0, then n may be updated to equal '0.' If n is greater than or equal to N, then n may be updated to equal 'N.' The LUT may be queried, at operation 1514, to obtain table data for K, $t_{min}$, and $T_{trig}$ at LUT2, LUT4, and LUT5 (see table 1550 as depicted in FIG. 15B), though the particular column for these values is provided merely for explanatory purposes. At operation 1518, the values obtained at operation 1514 may be output to the PWM image sensor to automatically update exposure settings.

Operation 1516 may occur if a mean brightness value is less than 1 as determined at operation 1506. In this situation, n may be set to equal N/2 before querying a LUT at operation 1514.

At operation 1520, an i value may be incremented by '1.' If, at operation 1522, i is less than or equal to 3, the operation may restart at operation 1504. Otherwise, if i is greater than 3, the method 1500 may end at operation 1524.

As described above, FIG. 15B depicts an example LUT 1550, including columns for mean brightness, LUT1, an address, and LUT2-LUT5. This LUT 1550 is provided merely for explanatory purposes and any potential LUT layout may be used in accordance with the provided disclosure.

Figure 16:
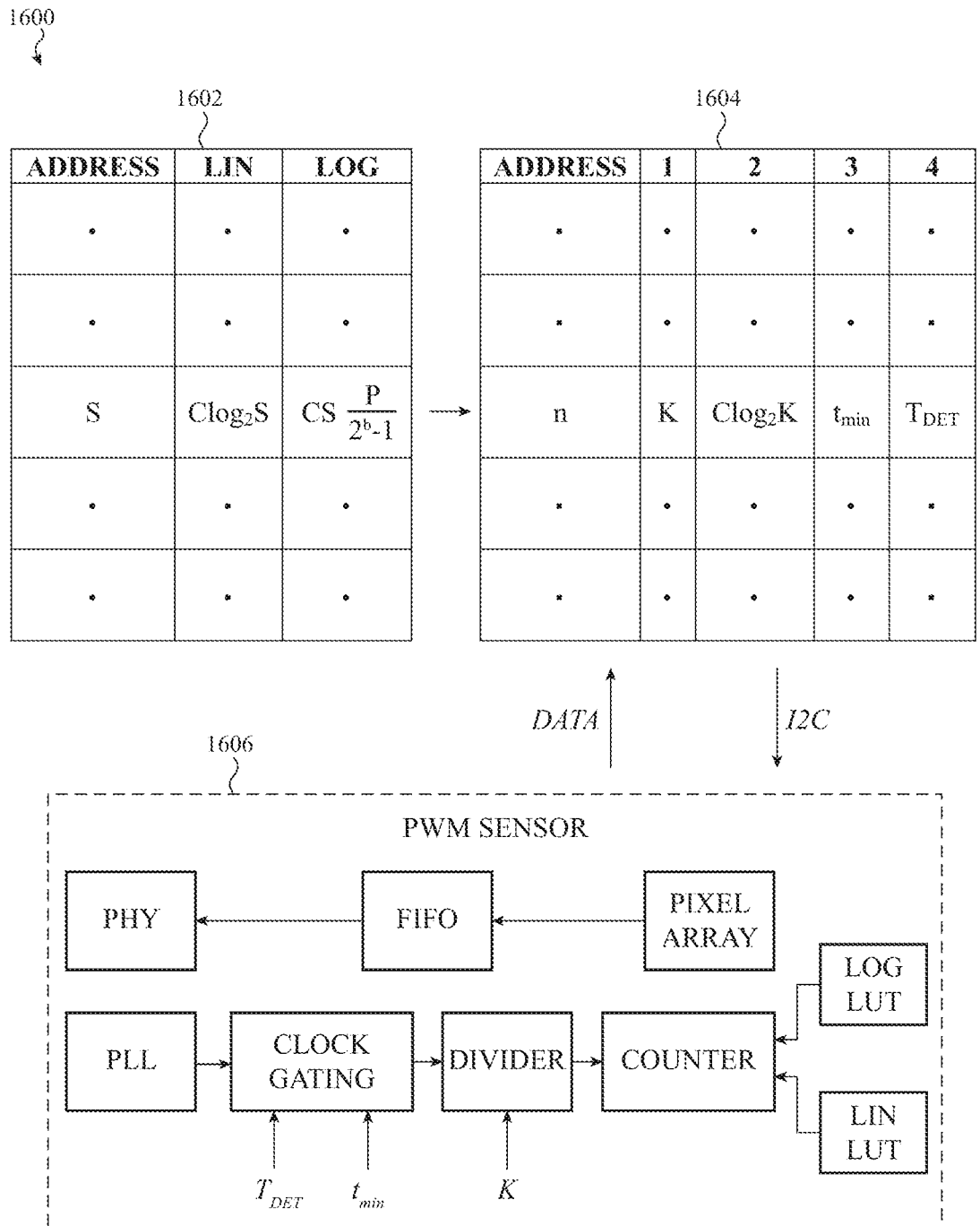
FIG. 16 depicts an example method and configuration of a logarithmic TDC mode for a single shot high dynamic range (HDR), as discussed herein.

FIG. 16 depicts an example LUT 1600 including a mean brightness S segment LUT 1602 and an illuminance segment LUT 1604. As discussed above, a logarithmic TDC mode may allow a PWM image sensor to capture a whole scene dynamic range (e.g., high dynamic range HDR) in a single shot. In this way, average illuminance of a scene may be measured to assist in identifying an illuminance segment n in the LUT 1600. In some cases, the illuminance segment n may be calculated by the equation $$n = C\log_2 L_{max} - C\log_2 L_{min} = CS\frac{P}{2^b - 1} - K2,$$

where S is the mean measured brightness, b is a bit depth of a TDC, P is a number of stops, and C and K2 are constants.

By identifying the correct illuminance segment n, appropriate scene brightness may be reached for a particular image without certain portions appearing too dark or too bright. As further depicted in FIG. 16, data may be transmitted from a PWM sensor 1606 to the LUT 1600. Further, I²C (inter-integrated circuit) may be used to attach the LUT 1600 (particularly the n segment 1604) to the PWM sensor 1606.

Additional processes may additionally occur during any time of the example operations. For example, to provide color to an image, a Bayer filter array may be provided and associated processing electronics may determine a color of any particular pixel. Further, software features may be provided to vary an operation of a PWM image sensor. Any component, structure, filter, method, process, and so on may be used in accordance with operations of a PWM image sensor.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A method of operation of a pulse-width modulation (PWM) image sensor, the method comprising:
   during a detection period, receiving a number of photons at a PWM pixel of the PWM image sensor;
   converting the number of photons into a photocurrent as the number of photons is received;
   accumulating a number of electrons at a sense node during the detection period, the number of electrons accumulated in response to the sense node receiving the photocurrent;
   during and in synchronization with the detection period, incrementing a count non-linearly, each value of the count synchronized with a non-linear time reference; and
   when the accumulated number of electrons reaches a threshold number of electrons, latching a value of the count in a memory of a time-to-digital converter (TDC) circuit.

2. The method of claim 1, wherein:
   the value of the count is latched in the memory at a triggering time, the triggering time having a non-linear relationship with the photocurrent; and
   as the triggering time increases, the count increments at a decreased rate.

3. The method of claim 1, wherein the time reference, t, is defined by $$t = \frac{2^b * t_{min}}{2^b - n},$$

where p is a bit depth or the TDC circuit, n is a counter step number, and $t_{min}$ is a counter delay.

4. The method of claim 3, wherein the counter delay is further defined by $$t_{min} = \frac{q * N_{TH}}{I_{max}},$$

where q is an elementary charge, $N_{TH}$ is the threshold number of electrons, and $I_{max}$ is a maximum producible photocurrent.

5. The method of claim 1, further comprising transmitting image information, corresponding to the latched value of the count in the memory of the TDC circuit, via a bi-directional bus.

6. The method of claim 1, further comprising terminating a duration of the detection period in response to the photocurrent.

7. The method of claim 6, wherein a higher photocurrent results in a shorter detection period and a lower photocurrent results in a longer detection period.

* * * * *